US012621006B2

(12) United States Patent
Fazeli Chaghooshi et al.

(10) Patent No.: US 12,621,006 B2
(45) Date of Patent: May 5, 2026

(54) BATCH DYNAMIC SUCCESSIVE CANCELLATION FLIP DECODING OF POLAR CODES

(71) Applicant: Apple Inc., Cupertino, CA (US)

(72) Inventors: Arman Fazeli Chaghooshi, Redwood City, CA (US); Louay Jalloul, San Jose, CA (US); Mohamad Mansour, San Jose, CA (US)

(73) Assignee: Apple Inc., Cupertino, CA (US)

( * ) Notice: Subject to any disclaimer, the term of this patent is extended or adjusted under 35 U.S.C. 154(b) by 25 days.

(21) Appl. No.: 18/920,780

(22) Filed: Oct. 18, 2024

(65) Prior Publication Data

US 2026/0113057 A1     Apr. 23, 2026

(51) Int. Cl.
　　*H03M 13/00*　　(2006.01)
　　*H03M 13/11*　　(2006.01)
　　*H03M 13/13*　　(2006.01)

(52) U.S. Cl.
　　CPC ....... *H03M 13/1108* (2013.01); *H03M 13/13* (2013.01)

(58) Field of Classification Search
　　None
　　See application file for complete search history.

(56) References Cited

U.S. PATENT DOCUMENTS

| | | | | |
|---|---|---|---|---|
| 11,398,842 | B2 * | 7/2022 | Fazeli Chaghooshi | ...................... H03M 13/2939 |
| 11,652,498 | B2 * | 5/2023 | Duffy | ................ H03M 13/6325 714/752 |

| | | | | |
|---|---|---|---|---|
| 11,894,859 | B1 * | 2/2024 | Arikan | .................. H03M 13/45 |
| 2017/0230141 | A1 | 8/2017 | Jeong et al. | |
| 2022/0231702 | A1 * | 7/2022 | Sunwoo | ............ H03M 13/2906 |
| 2022/0255565 | A1 * | 8/2022 | Sunwoo | ............ H03M 13/3753 |
| 2022/0302931 | A1 * | 9/2022 | Duffy | ................ H03M 13/6325 |
| 2022/0329350 | A1 * | 10/2022 | Sunwoo | ................ H04L 1/0057 |

(Continued)

OTHER PUBLICATIONS

Ercan, et al., "Practical Dynamic SC-Flip Polar Decoders: Algorithm and Implementation", Institute of Electrical and Electronics Engineers Transactions on Signal Processing, Sep. 12, 2020, pp. 5441-5456

(Continued)

*Primary Examiner* — Mujtaba M Chaudry

(74) *Attorney, Agent, or Firm* — Kilpatrick Townsend & Stockton LLP

(57)　　　　ABSTRACT

The present application relates to batch dynamic successive cancellation flip decoding of polar codes. In an example, an apparatus processes candidate codewords by using the batch dynamic successive cancellation flip decoding. The processing can include detecting a CRC failure for decoding a candidate codeword by using successive cancellation decoding. A list of flip patterns is generated for this candidate codeword and, similarly, for each of CRC-failed candidate codewords. These codewords are further batched decoded by iteratively selecting one of the flip patterns across the lists of flip patterns, decoding the corresponding candidate codeword and, if unsuccessful, updating metrics related to the flip pattern in a next decoding iteration. The batch decoding can be repeated until an expected number of codewords are successfully decoded or a maximum number of decoding iterations is reached.

20 Claims, 17 Drawing Sheets

800

(56) References Cited

U.S. PATENT DOCUMENTS

| | | | | |
|---|---|---|---|---|
| 2023/0084339 A1* | 3/2023 | Sunwoo | ............. | H03M 13/1108 |
| 2024/0048156 A1* | 2/2024 | Arikan | ............. | H03M 13/6561 |

OTHER PUBLICATIONS

Park, et al., "On the Performance of SC-Flip and SC-Perturbation Decoders for Parallel Decoding of Polar Codes", International Conference on Information and Communication Technology Convergence (ICTC), Institute of Electrical and Electronics Engineers, Oct. 20, 2021, pp. 1351-1356.

International Patent Application No. PCT/US2025/047546, "International Search Report and Written Opinion", Jan. 2, 2026, 14 pages

* cited by examiner

300

400

600

900

1100

1200

1300

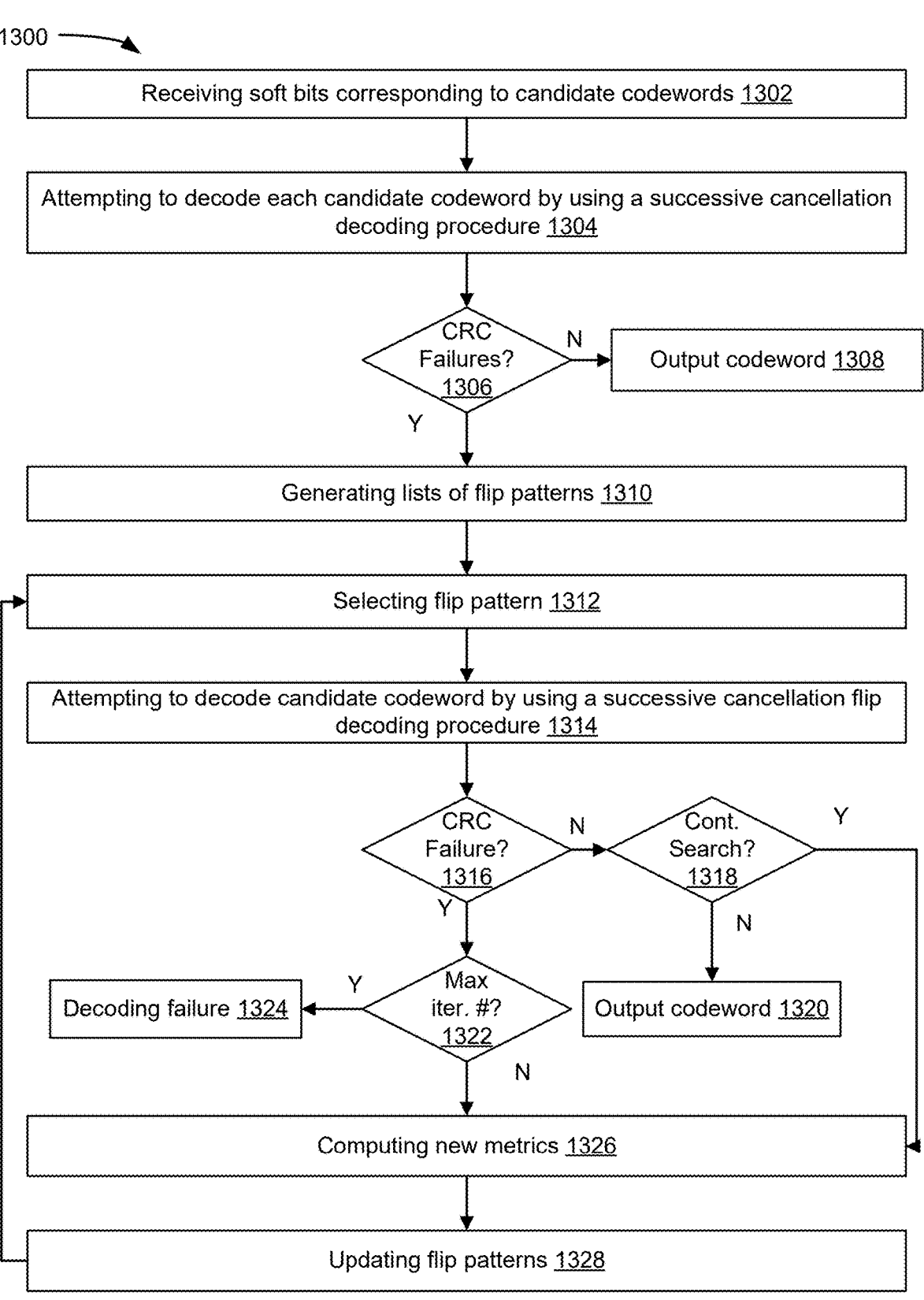

Receiving soft bits corresponding to candidate codewords 1302

Attempting to decode each candidate codeword by using a successive cancellation decoding procedure 1304

CRC Failures? 1306

N → Output codeword 1308

Y

Generating lists of flip patterns 1310

Selecting flip pattern 1312

Attempting to decode candidate codeword by using a successive cancellation flip decoding procedure 1314

CRC Failure? 1316

N → Cont. Search? 1318

Y →

N → Output codeword 1320

Y

Max iter. #? 1322

Y → Decoding failure 1324

N

Computing new metrics 1326

Updating flip patterns 1328

FIG. 13

1400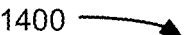

Accessing a plurality of lists of flip patterns, each list of the plurality of lists corresponding to a different candidate codeword that is generated according to a polar codes coding procedure <u>1402</u>

Storing a first list of flip patterns corresponding to a first candidate codeword <u>1404</u>

Storing a second list of flip patterns corresponding to a second candidate codeword, the first candidate codeword and the second candidate codeword generated according to a polar codes coding procedure <u>1406</u>

Selecting a flip pattern of the first list and the second list <u>1408</u>

Decoding a codeword by at least using the flip pattern in a successive cancellation flip decoding procedure for polar codes <u>1410</u>

FIG. 14

BATCH DYNAMIC SUCCESSIVE CANCELLATION FLIP DECODING OF POLAR CODES

BACKGROUND

Communications and data storage can implement techniques to detect and correct errors that may occur during communications or storage. For example, a base station can apply an encoding algorithm to information for transmission to a user equipment (UE). The UE can implement a decoding algorithm when processing information received from the base station. Similarly, memory write and read can implement encoding and decoding algorithms for information stored in memory. Ultimately, the decoded information needs to correspond to the original information. Nonetheless, for various reasons (including noise, interference, etc.), errors may exist. The coding and/or decoding algorithms can reduce the error rates.

BRIEF DESCRIPTION OF THE DRAWINGS

FIG. 13 illustrates an example of an operational flow/algorithmic structure for batch dynamic successive cancellation flip decoding in accordance with some embodiments.

FIG. 14 illustrates another example of an operational flow/algorithmic structure for batch dynamic successive cancellation flip decoding in accordance with some embodiments.

DETAILED DESCRIPTION

Figure 1:
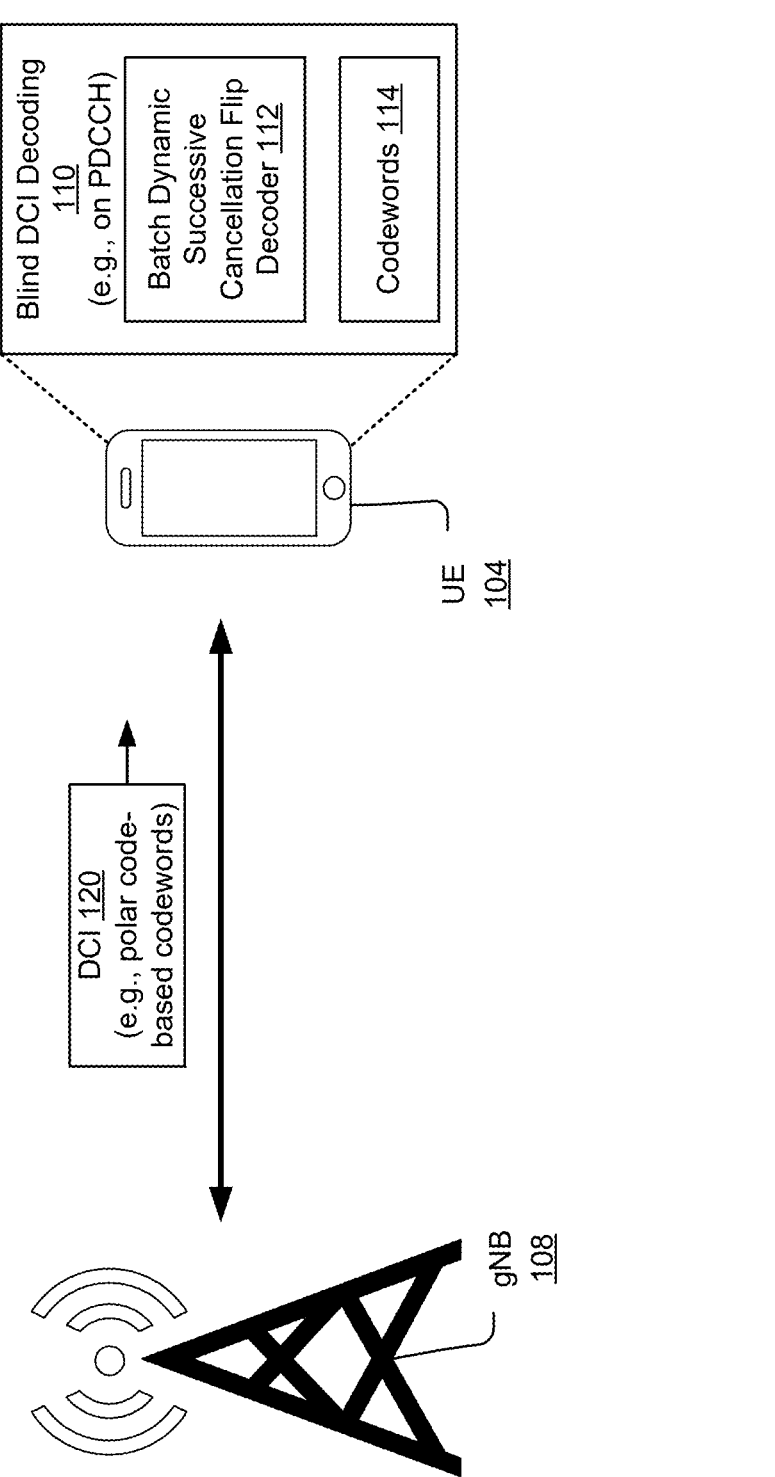
FIG. 1 illustrates an example of a network environment in accordance with some embodiments.

Embodiments of the present disclosure relate to, among other things, batch dynamic successive cancellation flip decoding of polar codes. In an example, a user equipment (e.g., a modulator/demodulator (modem) thereof) processes information received from a base station. The processing includes decoding candidate codewords. A candidate codeword can correspond to information (e.g., control information) that the base station encodes using particular error correction codes (e.g., polar codes). The processing can include attempting to decode the candidate codewords such that, in case of a decoding success, one or more codewords are successful decoded and the relevant information is determined. The decoding can use a batch dynamic successive cancellation flip decoding procedure. This procedure iteratively decodes the candidate codewords. In each decoding iteration, one of the candidate codewords can be selected and a flip pattern is chosen from a list of flip patterns corresponding to the selected candidate word to facilitate the decoding. Metrics associated with the candidate codewords are updated at each decoding iteration. Different candidate codewords can be selected through the decoding iterations such that the decoding is not trapped in processing an irrelevant candidate codeword. By doing so, it may be possible to improve the decoding performance (e.g., block error rate and power consumption) relative to other decoding techniques while also improving the decoding latency on average. These and other advantageous technical effects are further described herein below.

In the interest of clarity of explanation, various embodiments are described in connection with codewords that encode downlink control information (DCI) and with blind DCI detection. However, the embodiments are not limited as such and can similarly and equivalently apply to decoding other types of information. Such information can be stored in a memory (e.g., in the use case of data storage) and/or can be transmitted (e.g., between a base station and a UE). For example, a memory (e.g., a Not And (NAND) flash memory) can store information, where a block of the information is encoded for the storage (e.g., using polar codes). This information can represent indexing or addressing of data that an application requests via a memory read and/or the data itself. A batch dynamic successive cancellation flip decoding procedure of the present disclosure can be applied to processing the information upon the memory read.

The following detailed description refers to the accompanying drawings. The same reference numbers may be used in different drawings to identify the same or similar elements. In the following description, for purposes of explanation and not limitation, specific details are set forth, such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. For the purposes of the present document, the phrase "A or B" means (A), (B), or (A and B).

The following is a glossary of terms that may be used in this disclosure.

The term "circuitry" as used herein refers to, is part of, or includes hardware components, such as an electronic circuit, a logic circuit, a processor (shared, dedicated, or group) or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, a programmable system-on-a-chip (SoC)), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" "or "processing circuitry" as used herein refers to, is part of, or includes circuitry capable of sequentially and automatically carrying out a sequence of arithmetic or logical operations, or recording, storing, or transferring digital data. The term "processor circuitry" and "processing circuitry" may refer to an application processor, baseband processor, a central processing unit (CPU), a graphics processing unit, a single-core processor, a dual-core processor, a triple-core processor, a quad-core processor, or any other device capable of executing or otherwise operating computer-executable instructions, such as program code, software modules, or functional processes.

The term "interface circuitry" as used herein refers to, is part of, or includes circuitry that enables the exchange of information between two or more components or devices. The term "interface circuitry" may refer to one or more hardware interfaces, for example, buses, I/O interfaces, peripheral component interfaces, network interface cards, or the like.

The term "user equipment" or "UE" as used herein refers to a device with radio communication capabilities and may describe a remote user of network resources in a communications network. The term "user equipment" or "UE" may be considered synonymous to, and may be referred to as, client, device, mobile, mobile device, mobile terminal, user terminal, mobile unit, mobile station, mobile user, subscriber, user, remote station, access agent, user agent, receiver, radio equipment, reconfigurable radio equipment, reconfigurable mobile device, etc. Furthermore, the term "user equipment" or "UE" may include any type of wireless/wired device or any computing device including a wireless communications interface. The UE may have a primary function of communication with another UE or a network and the UE may be integrated with other devices and/or systems (e.g., in a vehicle).

The term "base station" as used herein refers to a device with radio communication capabilities, that is a device of a communications network (or, more briefly, network), and that may be configured as an access node in the communications network. A UE's access to the communications network may be managed at least in part by the base station, whereby the UE connects with the base station to access the communications network. Depending on the radio access technology (RAT), the base station can be referred to as a gNodeB (gNB), eNodeB (eNB), access point, repeater on a communications satellite, etc.

The term "channel" as used herein refers to any transmission medium, either tangible or intangible, which is used to communicate data or a data stream. The term "channel" may be synonymous with or equivalent to "communications channel," "data communications channel," "transmission channel," "data transmission channel," "access channel," "data access channel," "link," "data link," "carrier," "radio-frequency carrier," or any other like term denoting a pathway or medium through which data is communicated. Additionally, the term "link" as used herein refers to a connection between two devices for the purpose of transmitting and receiving information.

FIG. 1 illustrates a network environment 100, in accordance with some embodiments. The network environment 100 may include a UE 104 and a base station 108. The base station 108 provides a wireless access cell; for example, a Third-Generation Partnership Project (3GPP) New Radio (NR) cell, through which the UE 104 may communicate with the gNB. The base station 108 may include a set of transmission and reception points (TRPs). The UE 104 and the base station 108 may communicate over an interface compatible with 3GPP technical specifications, such as those that define Fifth-Generation (5G) NR system standards, Sixth-Generation (6G) standards, or the like.

The base station 108 may transmit information (for example, data and control signaling) in the downlink direction by mapping logical channels on the transport channels, then transport channels onto physical channels. The logical channels may transfer data between a radio link control (RLC) and media access control (MAC) layers; the transport channels may transfer data between the MAC and PHY layers; and the physical channels may transfer information across the air interface. The physical channels may include a physical broadcast channel (PBCH); a physical downlink control channel (PDCCH); and a physical downlink shared channel (PDSCH).

The PBCH may be used to broadcast system information that the UE 104 may use for initial access to a serving cell. The PBCH may be transmitted along with physical synchronization signals (PSS) and secondary synchronization signals (SSS) in a synchronization signal (SS)/PBCH block. The SS/PBCH blocks (SSBs) may be used by the UE 104 during a cell search procedure and for beam selection.

The PDSCH may be used to transfer end-user application data, signaling radio bearer (SRB) messages, system information messages (other than, for example, MIB), and paging messages.

The PDCCH may transfer downlink control information (DCI) that is used by a scheduler of the base station 108 to allocate both uplink and downlink resources. The DCI may also be used to provide uplink power control commands, configure a slot format, or indicate that preemption has occurred.

The base station 108 may also transmit various reference signals to the UE 104. The reference signals may include demodulation reference signals (DMRSs) for the PBCH, PDCCH, and PDSCH. The UE 104 may compare a received version of the DMRS with a known DMRS sequence that was transmitted to estimate an impact of the propagation channel. The UE 104 may then apply an inverse of the propagation channel during a demodulation process of a corresponding physical channel transmission.

The reference signals may also include a CSI reference signal (CSI-RS). The CSI-RS may be a multi-purpose downlink transmission signal that may be used for CSI reporting, beam management, connected mode mobility, radio link failure detection, beam failure detection and recovery, and fine-tuning of time and frequency synchronization.

The reference signals and information from the physical channels may be mapped to resources of a resource grid. There is one resource grid for a given antenna port, subcarrier spacing configuration, and transmission direction (for example, downlink or uplink). The basic unit of an NR downlink resource grid may be a resource element, which may be defined by one subcarrier in the frequency domain, and one orthogonal frequency division multiplexing (OFDM) symbol in the time domain. Twelve consecutive subcarriers in the frequency domain may compose a physical resource block (PRB). A resource element group (REG) may include one PRB in the frequency domain, and one OFDM symbol in the time domain, for example, twelve resource elements. A control channel element (CCE) may represent a group of resources used to transmit PDCCH. One CCE may be mapped to a number of REGs; for example, six REGs.

Transmissions that use different antenna ports may experience different radio channels. However, in some situations, different antenna ports may share common radio channel characteristics. For example, different antenna ports may have similar Doppler shifts, Doppler spreads, average delay, delay spread, or spatial receive parameters (for example, properties associated with a downlink received signal angle of arrival at a UE). Antenna ports that share one or more of these large-scale radio channel characteristics may be said to be quasi co-located (QCL) with one another. 3GPP has specified four types of QCL to indicate which particular channel characteristics are shared. In QCL Type A, antenna ports share Doppler shift, Doppler spread, average delay, and delay spread. In QCL Type B, antenna ports share Doppler shift and Doppler spread. In QCL Type C, antenna ports share Doppler shift and average delay. In QCL Type D, antenna ports share spatial receiver parameters.

The base station 108 may provide transmission configuration indicator (TCI) state information to the UE 104 to indicate QCL relationships between antenna ports used for reference signals (for example, synchronization signal/PBCH or CSI-RS) and downlink data or control signaling (for example, PDSCH or PDCCH). The base station 108 may use a combination of RRC signaling, MAC control element signaling, and DCI, to inform the UE 104 of these QCL relationships.

The UE 104 may transmit data and control information to the base station 108 using physical uplink channels. Different types of physical uplink channels are possible, including a physical uplink control channel (PUCCH) and a physical uplink shared channel (PUSCH). Whereas the PUCCH carries control information from the UE 104 to the base station 108, such as uplink control information (UCI), the PUSCH carries data traffic (e.g., end-user application data) and can carry UCI.

In an example, communications with the base station 108 can use channels in the frequency range 1 (FR1) band and/or frequency range 2 (FR2) band, although other frequency ranges are possible. The FR1 band includes a licensed band and an unlicensed band. The NR unlicensed band (NR-U) includes a frequency spectrum that is shared with other types of radio access technologies (RATs) (e.g., LTE-LAA, WiFi, etc.). A listen-before-talk (LBT) procedure can be used to avoid or minimize collision between the different RATs in the NR-U, whereby a device applies a clear channel assessment (CCA) check before using the channel.

The UE 104 can be located within a network coverage. In particular, the base station 108 may provide the network coverage with signaling (e.g., which may be carried by one or more beams). The network coverage may represent a cell or a portion of the cell that the base station 108 provides. The network coverage may provide network connections to multiple UEs, similar to the UE 104. These UEs may communicate with the base station 108 on both the uplink and the downlink based on channels available to them when the UEs are in the network coverage.

In an example, the UE 104 supports carrier aggregation (CA), whereby the UE 104 can connect and exchange data simultaneously over multiple component carriers (CCs) with the base station 108. The CCs can belong to the same frequency band, in which case they are referred to as intra-band CCs. Intra-band CCs can be contiguous or non-contiguous. The CCs can also belong to different frequency bands, in which case they are referred to as inter-band CCs. A serving cell can be configured for the UE 104 to use a CC. A serving cell can be a primary (PCell), a primary secondary cell (PSCell), or a secondary cell (SCell). Multiple SCells can be activated via an SCell activation procedures where the component carriers of these serving cells can be intra-band contiguous, intra-band noon-contiguous, or inter-band. The serving cells can be collocated or non-collocated.

The UE 104 can also support dual connectivity (DC), where it can simultaneously transmit and receive data on multiple CCs from two serving nodes or cell groups (a master node (MN) and a secondary node (SN)). DC capability can be used with two serving nodes operating in the same RAT or in different RATs (e.g., an MN operating in NR, while an SN operates in LTE). These different DC modes include, for instance, evolved-universal terrestrial radio access-new radio (EN)-DC, NR-DC, and NE-DC (the MN is a NR gNB and the SN is an LTE eNB).

As further described in connection with the next figures, the base station 108 can send DCI 120 in PDCCH to the UE 104. The UE 104 can perform blind DCI decoding 110 on the PDCCH to determine the DCI 120.

In one example, the base station 120 (e.g., an RF transmit chain thereof, or a component of this chain such as an encoder) encodes the DCI 120 using an encoding algorithm (e.g., one for polar codes). Accordingly, the actual signals that are transmitted represent one or more codewords that encode the DCI 120 and that enable error detection and correction at the UE 104.

The UE 104 (e.g., an RF receive chain thereof) can receive and process the signals. Due to noise, interference, and other signals, errors may have been introduced in the transmission and/or reception. The processing can include decoding candidate codewords (e.g., detected blocks of information that correspond to the codewords and that may include errors) to correct, if possible, the errors, decode the one or more codewords (shown as codewords 114 upon the decoding), and accordingly determine the DCI 120 based on the codewords 114. The decoding can be implemented by a batch dynamic successive cancellation flip decoder 112 as further described herein below.

Figure 2:
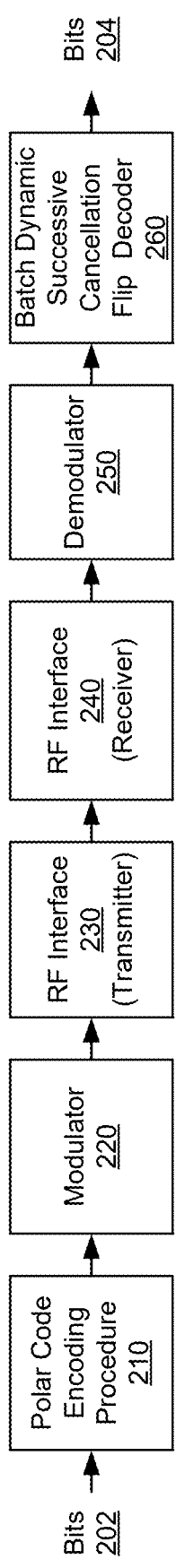
FIG. 2 illustrates examples of a system for error detection and correction in accordance with some embodiments.

FIG. 2 illustrates examples of a system 200 for error detection and correction in accordance with some embodiments. As illustrated, the system 200 includes a transmit chain 201 and a receive chain 203 for a downlink path. The transmit chain 201 can be included in a radio frequency front end of a base station for processing information 202 (including DCI) and transmitting signals that represent the information 202 to UEs. The receive chain 203 can be included in a radio frequency front end of a UE for receiving and processing such signals to determine information 204. Equivalently for an uplink path, a similar transmit chain can be included in the UE (e.g., for transmitting UCI or other information) and a similar receive chain can be included in the base station (e.g., for receiving such information).

Error detection and/or correction can be implemented such that the information 204 is the same as the information 202 or any resulting error rate is smaller than an acceptable threshold error rate. To do so, the transmit chain 201 can include a polar code encoder 210, whereas the receive chain can include a batch dynamic successive cancellation flip decoder 260.

In an example, the polar code encoder 210 can process bits that represent the information 202 at a block level (e.g., in information blocks). Bits that represent an information block can be encoded using polar codes to generate one or more codewords. The generated codewords can be passed to physical layer components 220 of the transmit chain 201, such as a scrambler, a modulator, a precoder, and/or a resource element mapper, such that the codewords can be modulated and mapped onto resource elements. An RF interface 230 of the transmit chain (e.g., a transmitter coupled with a set of antennas) can then output the corresponding signals.

The signals can be received by an RF interface 240 of the receive chain 203 (e.g., a receiver coupled with a set of antennas). Following a set of operations (e.g., amplifying, frequency shifting, filtering, analog to digital conversion, etc.), physical layer components 250 of the receive chain (e.g., descrambler, demodulator, etc.) can output candidate codewords to the batch dynamic successive cancellation flip decoder 260 that in turn decodes the candidate codewords and, if the decoding is successful, can output bits that represent the information 204.

In an example, the input to the batch dynamic successive cancellation flip decoder 260 includes soft bits. A soft bit can represent a binary value (e.g., a one or zero) and a likelihood of that value to be correct (e.g., a log likelihood ratio (LLR)). A group of soft bits can correspond to a symbol (which may depend on the modulation technique). The output of the batch dynamic successive cancellation flip decoder 260 can be a hard decoding decision: a binary value (e.g., a one or a zero) for each bit if the decoding is successful.

In an example, the information 202 includes DCI. The batch dynamic successive cancellation flip decoder 260 can be used for DCI blind decoding. In this case, a maximum candidate number codewords can be decoded. This maximum number can be, for example, forty-four in the use case of a 5G NR system.

As further described herein, other types of the decoder in the receive chain are possible 203 including a successive cancellation decoder (including one implementing successive cancellation list (SCL) and cyclic redundancy check (CRC)-aided successive cancellation list (CA-SCL) decoding) and flip-based iterative decoders (including a successive cancellation flip (SCF) decoding and a dynamic successive cancellation flip decoder (DSCF) decoding). A genie-aided dynamic successive cancellation flip decoder, where a genie informs the decoder of the correct candidates, can represent an optimal decoder but may not be practical or possible to implement. In comparison, a batch dynamic successive cancellation flip decoder of the present disclosure, such as the batch dynamic successive cancellation flip decoder 260, can have a very comparable error rate performance of the genie-aided dynamic successive cancellation flip decoder (e.g., far superior that that of the successive cancellation decoder or the dynamic successive flip decoder), while being practical to implement (e.g., in terms of power consumption, memory space, processing latency, and/or chip area).

Generally, SCL decoding and CA-SCL decoding have been used for polar codes and CRC-precoded polar codes. SCL decoder not only provides a significant performance improvement when compared against a conventional successive cancellation (SC) decoder, but also provides a tool to utilize the CRC information for enhanced error correction. Traditionally, CRC information is only used for error detection. However, in the context of the list decoders, it can be used to further prune the decoding candidates either throughout the decoding process or upon reaching the final stage, both improving the overall error probability. However, the downside to the SCL decoders is that they necessitate significantly more computational power and memory compared to the basic SC decoder. In fact, comparing the unoptimized architectures, the computational and memory requirements in the SCL scale proportional to the list size, commonly denoted by L. The computational requirements of flip-based SC decoders scale proportional to the average number of decoding iterations.

SCF decoders are a class of decoding algorithms customized for polar codes that provide a different mechanism to utilize CRC information for error correction without necessitating a significant increase in memory and computational resources. The fundamental of SCF decoding is rooted in repeated low-complexity decoding attempts, where certain decisions throughout the decoding are flipped in each iteration to capture the most-likely scenarios. The SCF decoders utilize the CRC information to (in) validate the results after each iteration. Hence, the CRC is used as a stopping criterion, which enhances the error correction by eliminating the incorrect decoder outputs.

The SCF decoders, if designed properly according to the channel characteristics, necessitate one or a few iterations on average to converge to a CRC-valid codeword. Given a desired block error rate (BLER), the average number of decoding attempts is usually significantly less than the list size used for CA-SCL to obtain the same BLER, which explains the reduction in average power consumption. However, the maximum number of iterations is usually set to the large number, which makes the comparison in worst case scenarios unfavorable for the flip-based decoders. For DSCF decoding, a metric is computed after each iteration for various possible future flip patterns and the list of the scheduled flip patterns for future iterations can be updated accordingly.

The DSCF decoder is particularly useful in moderate to high signal-to-noise ratio (SNR) values, in which it can find a CRC-valid codeword near the received symbol in less than two iterations on average. This can be a computational complexity reduction compared to the list decoder, where a large constant number of computations are spent regardless of quality of the received symbols. However, this may not hold true in setups such as polar decoding for 5G NR PDCCH, where the decoder is assigned to both find and decode the candidates with valid DCIs (e.g., in blind decoding situations). When the SCL decoder is initiated with received symbols that correspond to an invalid candidate, the decoder often fails at finding any CRC-valid codewords, excluding the false positive scenarios. In a sense, the decoder is used for both detection and decoding purposes. However, if the same input is provided to the DSCF decoder, it often locks into reaching the maximum number of iterations as none of the polar codewords in the proximity of the received symbols pass the CRC. In this scenario, which is indeed the most common for 5G NR PDCCH, the DSCF decoder ends up consuming significantly more computational power that the SCL decoder. Embodiments of a batch dynamic successive cancellation flip (Batch-DSCF) decoding algorithm in the present disclosure can address such and other concerns.

The Batch-DSCF decoder decodes multiple PDCCH candidates simultaneously (referred to herein as candidate codewords in the context of DCI decoding). This decoder begins by performing the basic SC decoding on all candidates at first to form lists of flip patterns for next iterations corresponding to each candidate. Then, the lists are merged into a single batch and the flip patterns are sorted again based on their DSCF metrics in the merged list. The Batch-DSCF decoder at each step selects the most likely flip pattern to produce a CRC-valid polar codeword from the batch and updates the merged list accordingly. Batch-DSCF continues the decoding until a certain number of CRC-valid codewords are detected (e.g., decoding success) or the DSCF metric reaches a determined threshold (e.g., decoding failure). By doing so, the Batch-DSCF can be thought as employing a decoding stop criterion that is shared among all PDCCH candidates that are to be decoded simultaneously, which reduces the average number of decoding attempts on PDCCH candidates with invalid DCIs.

The Batch-DSCF decoder further allows utilizing blind detection metrics such as those that are based on channel observation as well as DCI statistics to be incorporated into the DSCF metric to alter the ordering of the queued flip patterns to improve the convergence rate or to arrive at a different tradeoff between mis-detecting error and mis-decoding error. The numerical results, as shown in the next figures, suggest that the Batch-DSCF decoder yields significant computational savings when compared to the conventional SCL decoder or individual DSCF in presence of strong statistical assumptions over the DCI distributions.

Figure 3:
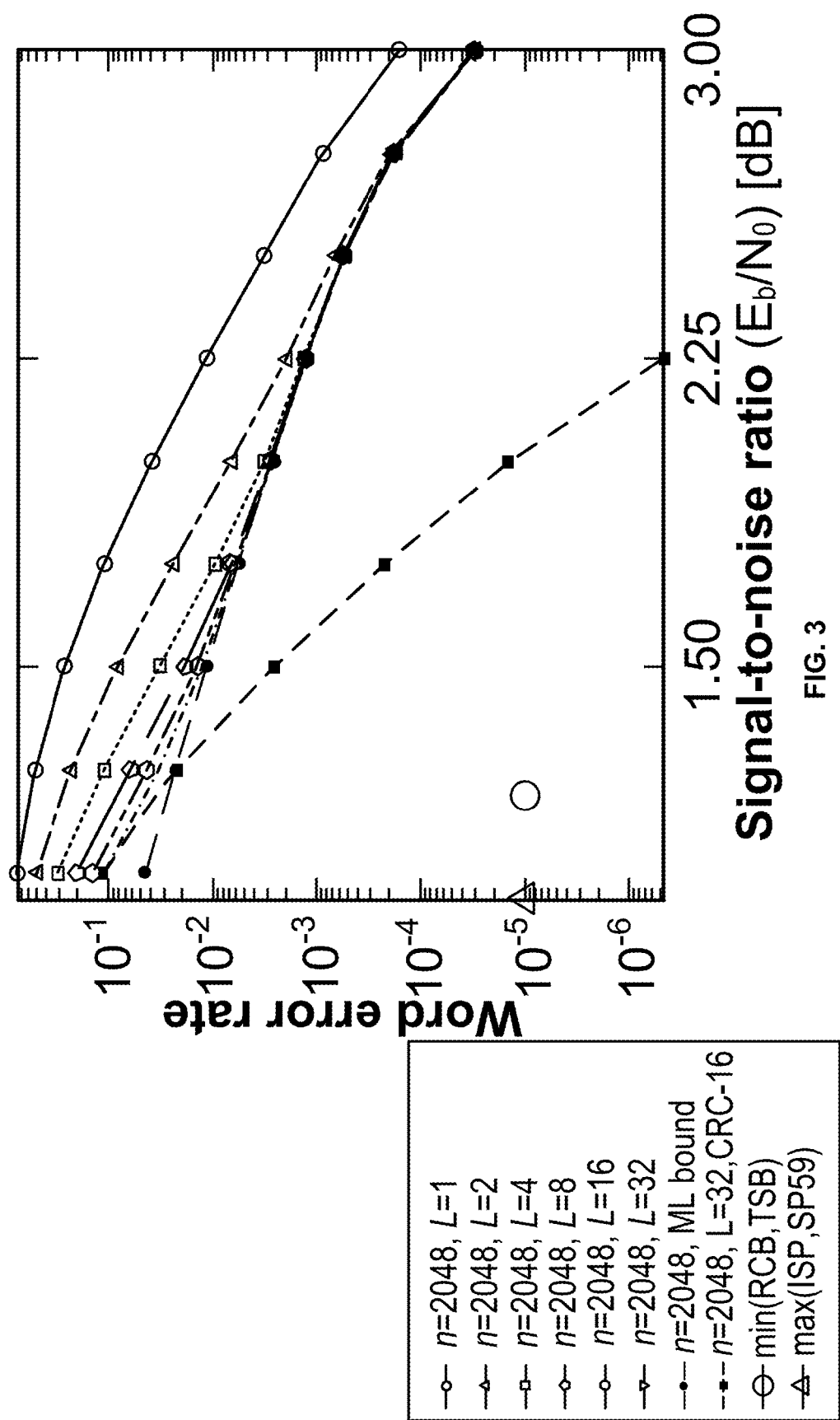
FIG. 3 illustrates performances examples of various polar decoding algorithms in accordance with some embodiments.

FIG. 3 illustrates performance examples 300 of various polar decoding algorithms in accordance with some embodiments. Polar coding can be understood using the following notations. Let us denote the vectors of uncoded data and the corresponding codeword by $u=(u_0, u_1, \ldots, u_{n-1})$ and $c=(c_0, c_1, \ldots, c_{n-1})$, where n denotes the code-length. For an (n, k) polar code, the vector u comprises of k information bits and n−k frozen bits that are pre-determined and usually set to "0". The SC decoding algorithm can achieve the symmetric channel capacity as the code-length increases. The SC decoder is based on decoding $u_i$'s one by one in a sequential way, where at each step, the following likelihood values $$Pr\left(u_i = t \mid Y, \hat{u}_0^{i-1}\right)$$

for "t=0,1," or the corresponding LLRs for a more hardware-friendly implementation $$L_i = \log\left(\frac{Pr\left(u_i = 0 \mid Y, \hat{u}_0^{i-1}\right)}{Pr\left(u_i = 1 \mid Y, \hat{u}_0^{i-1}\right)}\right)$$

are computed and a hard decision is made according to the following rule:

$$\hat{u}_i = h(L_i) = \begin{cases} 0 & \text{if } u_i \text{ is frozen} \\ \dfrac{1 - \text{sign}(L_i)}{2} & \text{if } u_i \text{ is non-frozen} \end{cases}.$$

Numerical results suggest that SCL decoding with moderate list sizes can achieve an error correction performance close to that of the maximum likelihood (ML) decoder. Furthermore, SCL decoding can be modified to utilize CRC verification in CRC-precoded polar codes to eliminate invalid candidates at the end of the decoding, which greatly enhances the Block Error Rate (BLER) performance. This variation of the decoding algorithm is commonly referred to as the CA-SCL.

The performance examples 300 correspond to plots of the word error rate as a function of the SNR for different list sizes. It is to be noted that polar codes under just the SC decoder are proven to achieve the channel capacity. However, the low convergence speed can make these decoders unattractive for practical purposes. The SCL decoder with even moderate list sizes, such as "L=4" or "L=8," is shown to perform nearly as good as the Maximum Likelihood (ML) decoder. CA-SCL decoding of CRC-precoded polar codes achieve a significantly smaller decoding error probability, which makes polar code suitable for practical use cases particularly at short-to-moderate code lengths.

While CA-SCL achieves superior error correction performance, it may necessitate maintaining multiple decoding paths on the polar decoding tree, which in turn consumes additional computational power and requires additional memory that is scaled with the list size parameter, commonly denoted by L.

While the SC decoder has a worse error recovery performance than the SCL decoder, it consumes significantly less computational power. A hybrid decoding method is to call the SC decoder first, cross check the decoded vector against CRC, and then only call the SCL decoder when the SC output fails to pass the CRC check. Consider the length n=2048 polar code in FIG. 3 at "SNR=1.75 dB." The SC decoder can decode the transmitted vector in nearly ten percent of the time. Hence, the hybrid decoder goes to the second phase only at around ten percent of the time. Even through the worst-case computational complexity is increased, the average power consumption is significantly reduced. This strategy is behind iterative decoders.

A downside of the hybrid decoder described above is that, while the average power consumption is reduced significantly, the decoder still needs to support the SCL decoding, which translates to significantly additionally memory and chip area. The SCF decoders can be designed to address this concern. Similar to the hybrid decoder, SCF decoder starts the decoding by calling the initial SC decoding. The following iterations in SCF includes new SC decoding attempts, where certain decisions made throughout the previous SC attempts are forcefully flipped to force the decoder to explore alternative decoding paths on the decoding binary tree. The difference between various SCF decoding algorithms is embedded in the method they utilize each to generate these flip patterns.

Figure 4:
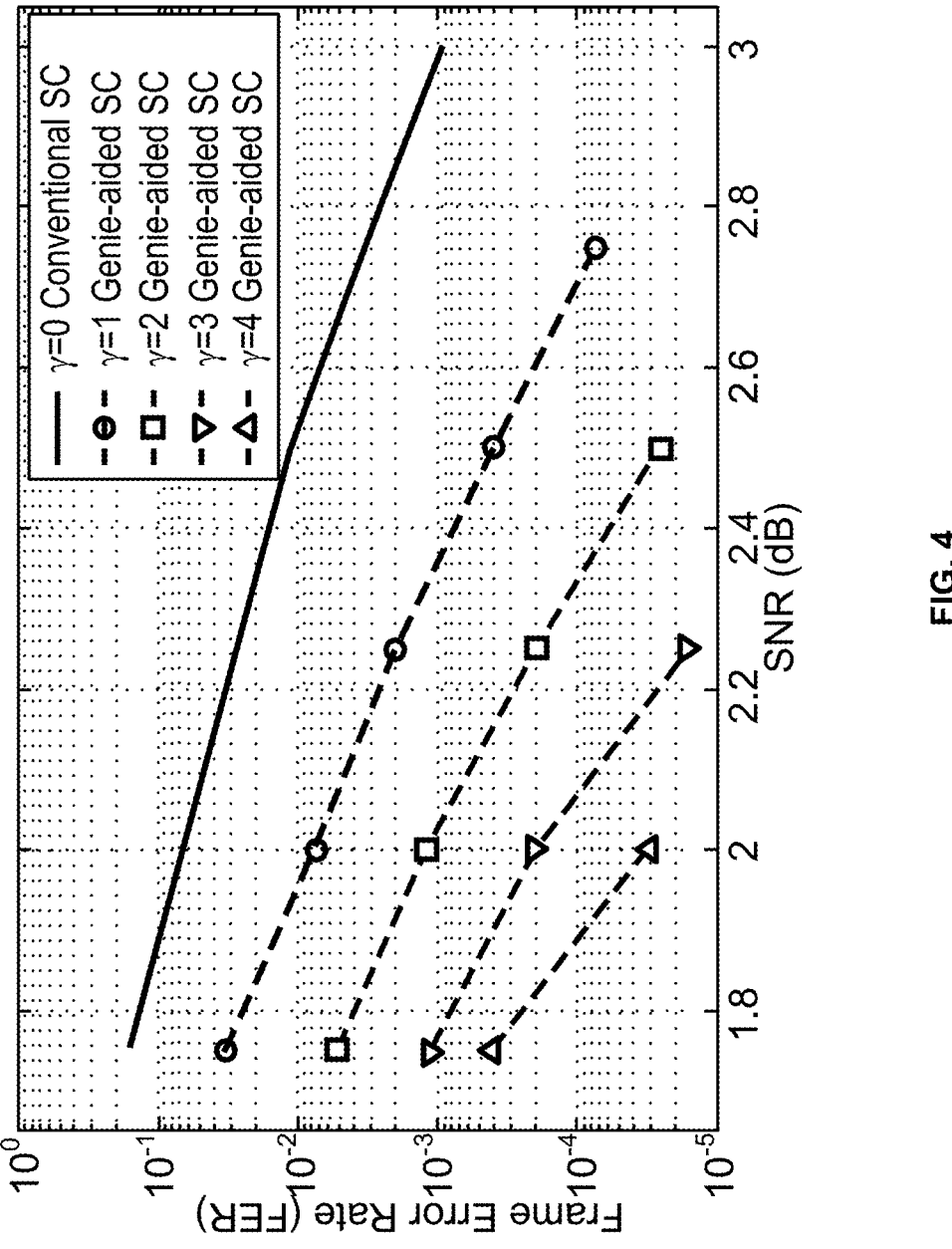
FIG. 4 illustrates examples of frame error rates in accordance with some embodiments.

FIG. 4 illustrates examples 400 of frame error rates in accordance with some embodiments. Flip based iterative SC decoding algorithms of polar codes are rooted in a phenomenon known as the genie-aided SC decoding. While the SC decoder itself does not do a great job in recovering the errors, its performance can be significantly enhanced if the decoder is aided by a genie which can intervene only for a few times and fix the decoding trajectory when an incorrect hard decision is made throughout the decoding process. Examples 400 illustrate the performance gain (the frame error rate as a function of the SNR) by utilizing the genie in SC decoding only for a small number of times.

However, in reality, it may not be possible to construct a flow of side information that can perfectly replicate the genie's intervention. Precoding polar codes with a CRC is in fact an attempt at constructing some side information for a secondary error correction. However, it can only be verified at the end of the decoding process. Furthermore, the CRC itself only signals that an error has occurred. The CRC does not reveal much information about the location of the incorrect decision.

An SCF decoder can address the lack of information about the error location by creating a list of flip patterns that are likely to contain the actual error pattern. These flip patterns are designed according to the reliability of the decisions made throughout the decoding process as well as the statistical knowledge about the reliability of each bit-channel. While the SCF decoder may not be capable of precisely fixing the error location(s) in the iterations that follow the original SC, the SCF decoder can get there upon iterating over a few, and in some cases more than a few, attempts. The more iterations the SCF decoder is allowed to perform, the more likely the SCF decoder is to recover the error locations and fix the decoding trajectory.

Improvement to the SCF decoding algorithm can be made including adding a metric to better prioritize the flip patterns for future iterations, extension to list decoding variations, and hardware improvement strategies. Another improvement includes replacing the predefined flip patterns with a method of dynamic flip generation on the fly according to the soft bits computed in the previous iterations. This method, called DSCF decoding is shown to significantly increase the convergence speed such that the dynamic decoder is able to prune the list of flip patterns by a factor of ten or more compared to the original SCF decoding algorithm. The improved convergence speed enables the DSCF decoder to achieve performances close to that of the genie-aided SC decoder as illustrated in FIG. 5.

Figure 5:
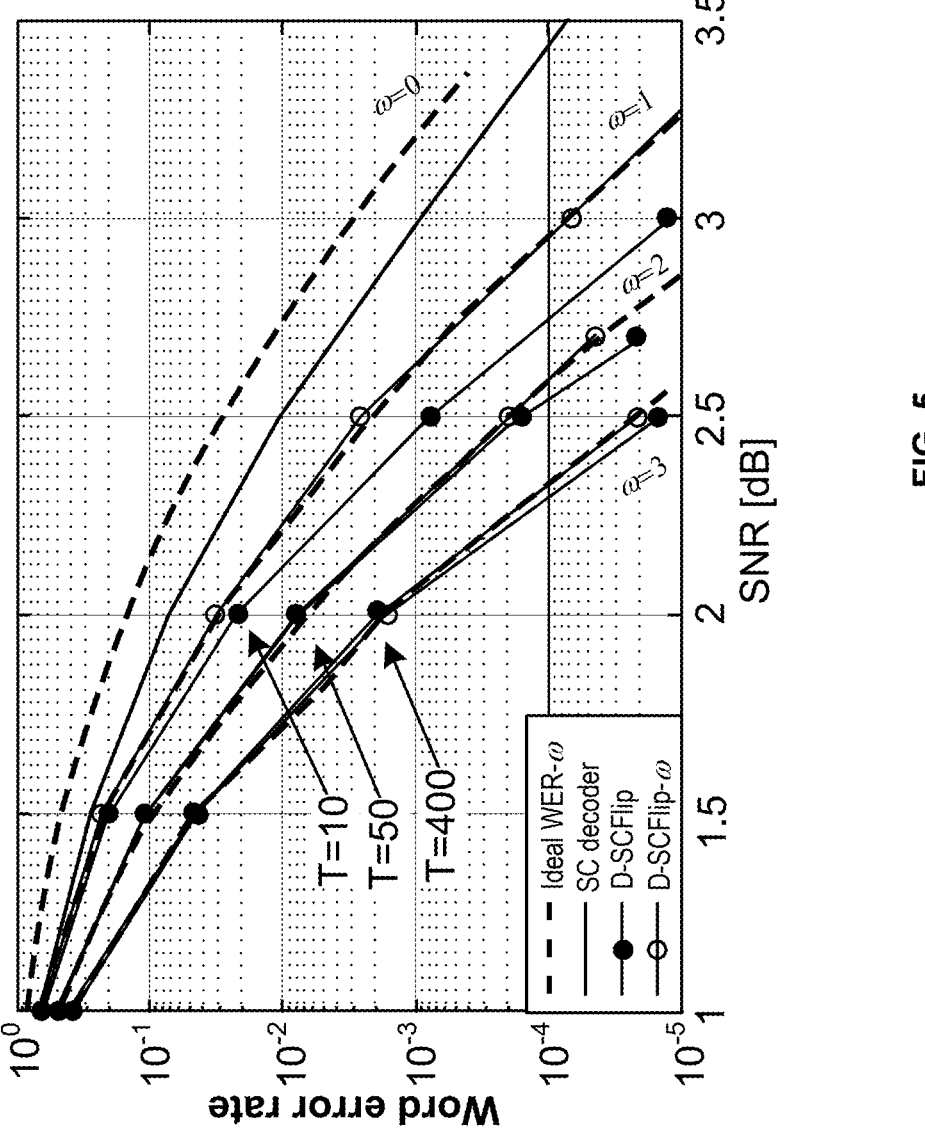
FIG. 5 illustrates performance examples of dynamic successive cancellation flip decoding in accordance with some embodiments.

FIG. 5 illustrates performance examples 500 of dynamic successive cancellation flip decoding in accordance with some embodiments. The performance examples 500 (shown as a word error rate as a function of SNR) of the DSCF decoder correlates to the maximum number of iterations that the decoder is allowed to perform. This parameter, commonly denoted by T, need only be in the range of ten to fifty in order for the DSCF decoder to match the performance of the genie-aided decoder with one or two interventions.

Figure 6:
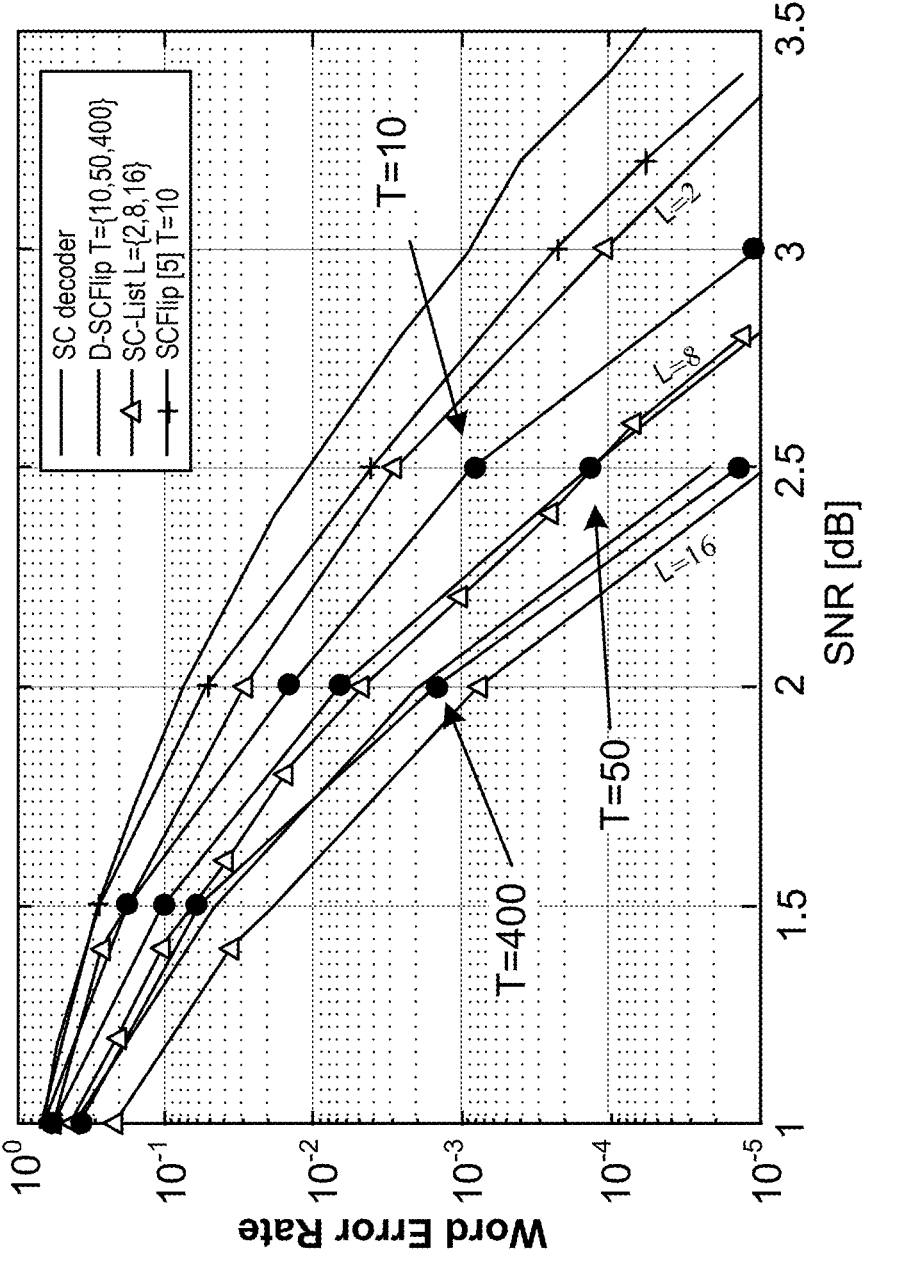
FIG. 6 illustrates other performance examples of dynamic successive cancellation flip decoding in accordance with some embodiments.

FIG. 6 illustrates other performance examples 600 of dynamic successive cancellation flip decoding in accordance with some embodiments. The performance examples 600 demonstrate the performance (e.g., word error rate as a function of SNR) comparison between a DSCF decoder and the non-iterative SCL decoding algorithm at various computational limits for a length 1 k polar code at rate 1/2. The DSCF decoder outperforms the SCL decoding performance with "L=2, 4, 8" at "$T_{max}$=10, 25, 50." At any comparison point, the DSCF decoder consumes more power than the SCL decoder in the worst-case scenario, which can be roughly estimated by the comparison between L and $T_{max}$. However, the DSCF decoder is often capable of decoding the transmitted vector at the first attempt or via very few trials, which contributes to significant power consumption savings on average. This is captured in the average number of decoding attempts that the DSCF must make in order to decode the received vector as shown in FIG. 7.

Figure 7:
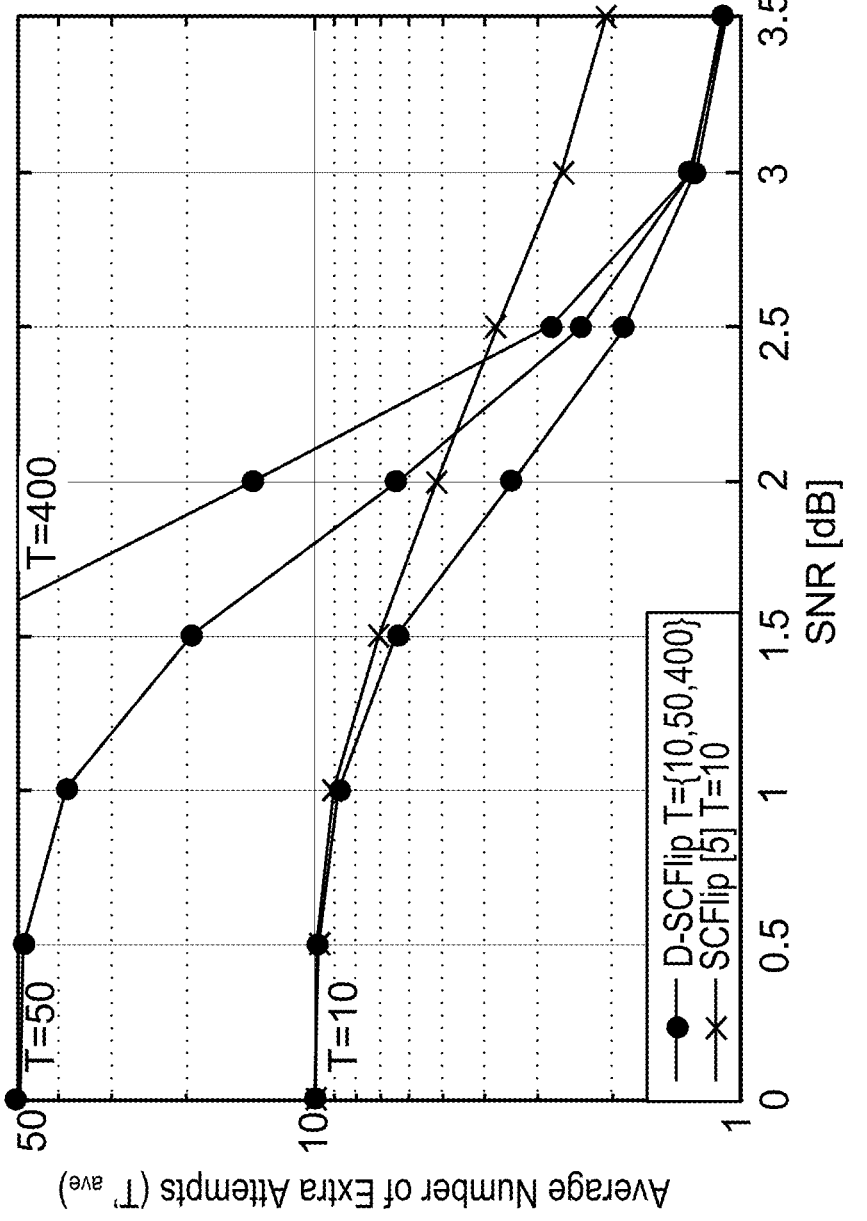
FIG. 7 illustrates examples of numbers of decoding attempts in dynamic successive cancellation flip decoding in accordance with some embodiments in accordance with some embodiments.

FIG. 7 illustrates examples 700 of numbers of decoding attempts in dynamic successive cancellation flip decoding in accordance with some embodiments in accordance with some embodiments. Examples 700 depict the average count of iterations for DSCF decoding at various $T_{max}$ values as a function of SNR. As illustrates, while the dynamic decoder with larger values of $T_{max}$ has a better frame error rate, it comes at an increase in the average power consumption particularly in low SNR regions. However, a proper design of the code parameters in practical application usually calls for a desired BLER of $10^{-2}$ or less, which in the examples 700 corresponds to SNR~2.5 dB. The dynamic decoder needs less than two iterations on average to achieve the same performance as the SCL decoder with "L=8."

Generally, DSCF decoding is based on generating a list of flip patterns, each associated with a metric, that the decoder uses in each iteration to determine the locations in which it should make a flipped decision. For a given flip pattern $\omega=\{i_1, i_2, \ldots, i_s\}$, the dynamic metric with perturbation parameter a can be computed by:

$$M_\alpha(\omega) = \prod_{j \in \omega} \exp(-\alpha \,|\, L_j \,|) \prod_{j \in I, j \notin \omega, j \leq max(\omega)} \frac{1}{1 + \exp(-\alpha \,|\, L_j \,|)}$$

where $L_j$ corresponds to the latest soft bit that is computed for non-frozen bit at location j through the previous iterations. Upon each iteration, the DSCF decoder computes the metrics for possible new flip patterns and updates the list on memory according to the newly estimated likelihoods.

Figure 8:
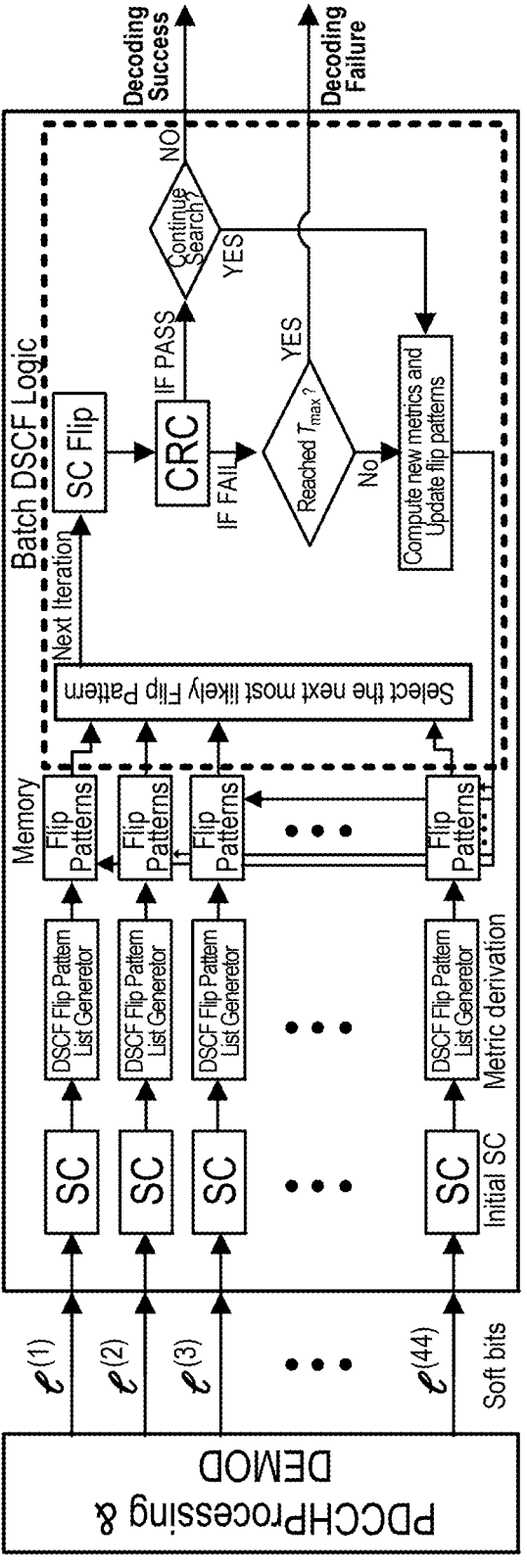
FIG. 8 illustrates an example of a batch dynamic successive cancellation flip decoder in accordance with some embodiments.

FIG. 8 illustrates an example 800 of a batch dynamic successive cancellation flip decoder in accordance with some embodiments. DSCF decoding can achieve the same error correction performance as CA-SCL decoding while necessitating significantly less computational power on average at moderate-to-high SNR regions. A drawback of the DSCF decoding is its unpredictability. A main design parameter in DSCF is $T_{max}$, which determines the maximum number of iterations that the decoder is allowed before it abandons decoding. $T_{max}$ needs be large enough to cover the extreme cases, which is how the DSCF decoder matches the performance of the CA-SCL decoding. However, large values of $T_{max}$ also necessitate additional flexibility in time and power. In tight settings, where the decoder needs finish the decoding process within a certain limited time, $T_{max}$ often cannot be large enough.

However, DSCF decoding is much more practical when the decoder is assigned to decode many polar transmissions within a given time window. This comes from the fact that in reasonable SNR regions, most of the transmissions are decoded within only one or two iterations. Pooling the decoding time constraints into a single window allows the decoder to share the resources for the worst-case scenario, which effectively increases the $T_{max}$ parameter.

For a 5G NR PDCCH channel, the decoder is asked to decode multiple polar transmission upon each setup. As such, a DSCF decoder can be a good choice and can be preferred over a CA-SCL decoder. However, careful consideration may be needed. Particularly, the main advantage of the iterative decoders such as DSCF is that they are likely to successfully decode the received symbols within a short time and only need extended computational power in rare occasions. This cannot be guaranteed in the context of blind decoding for 5G NR PDCCH. In fact, the PDCCH decoder is assigned to not only decode the intended transmissions, but to also detect the correct ones. Many of the candidates within a given PDCCH search space correspond to invalid DCI information, or simply random symbols that are not carrying any polar symbols. In those cases, the DSCF fails to decode the Rx symbols within a few iterations. In fact, it is likely that the DSCF decoder will continue iterating until it reaches the $T_{max}$ limit and that may completely negate the expected power savings.

Batch-DSCF decoding can address such a challenge. An idea behind the Batch-DSCF decoding is to merge the decoding process of all blind decoding candidates together. This method of joint decoding for all candidates enables the decoder to focus future iterations on those candidates that are more likely to carry a valid DCI and, therefore, terminating the decoding process once all the DCI information is derived. In other words, the decoding termination condition is shared among all candidates so that once the right polar transmissions are estimated, the decoder no longer spends computational power on the nonsense candidates. The Batch-DSCF decoding can achieve the same performance as CA-SCL decoding while requiring significantly less computational power on average.

Example 800 depicts an architecture of a Batch-DSCF decoder for joint decoding and blind detection of 5G NR PDCCH. Up to forty-four candidate codewords are produced and passed on to the decoder upon PDCCH processing and demodulation in the forms of input LLRs (soft bits). The Batch-DSCF decoder begins by running an initial SC decoder on each candidate and then generates a list of flip patterns for each candidate that fail the CRC upon the initial SC attempt. These flip patterns are stored in memory and are to be updated upon each iteration.

At each iteration, the Batch-DSCF decoder selects a candidate codeword with most likely flip patterns (e.g., having the best metric(s)), and passes it to an SCF decoding module. The SCF decoding module attempts another SC decoding on the corresponding candidate codeword (e.g., by using the flip pattern having the best metric among the list of flip patterns of the selected candidate codeword) while following the certain flipped decisions that are indicated by the selected flip pattern and passes the output binary vector to a CRC check. If the CRC passes, the Batch-DSCF decoder has found a valid polar codeword with valid DCI information. The Batch-DSCF decoder then has the option to abandon or to continue the decoding process depending on how many DCI vectors are expected to be decoded from the Batch-DSCF decoder.

If the CRC check fails or if the Batch-DSCF decoder is expected to deliver additional DCI information, it may decide to prepare the next iteration assuming the number of decoding iterations has not reached the $T_{max}$ value yet. To prepare the next decoding iteration, the Batch-DSCF decoder can either eliminate the candidate codeword that was last passed to the SCF decoding module (if CRC passed) or to compute metrics for the new flip patterns and update the corresponding list for that candidate codeword. The next iteration can pick the flip pattern with best metric, which could come from the same candidate codeword or another candidate codeword (e.g., the same or another candidate codeword can be selected, where the selection can be based on the flip pattern having the best metric, where the flip pattern may have been updated from the current decoding iteration).

The decoding process continues until all the expected DCI information is found or if the maximum number of decoding iterations $T_{max}$ is reached. Because the decoding iterations are shared among all candidates, the proposed Batch-DSCF decoder can be modified in a variety of ways to accommodate the desired performance. The following are some examples. In one example, $T_{max}$ can be imposed in the most general way, not limiting the decoding iterations on individual candidates. This can improve the decoding error by allowing the decoder to perform additional iteration on a given candidate if necessary. On the other hand, it may increase average power consumption since if the Batch-DSCF decoder locks into an invalid candidate codeword, this decoder may consume additional power without arriving at a DCI-valid polar estimate. In another example, a limit for the maximum or total number of decoding iterations can be imposed on each individual candidate codeword with a parameter such as $$T_{max}^{per\ candidate\ codeword}$$

(also referred to as $Q_{max}$). As such, while the Batch-DSCF decoder is free to jump from iterating over a candidate codeword to another candidate codeword at every step, the total number of attempts per candidate codeword are limited. This variation of the Batch-DSCF decoder can yield the exact same error correction performance as using $T_{max}$ while having a better chance of not locking into an invalid candidate codeword due to the added freedom. In yet another example, the Batch-DSCF decoder can operate in between the two cases by having both $T_{max}$ and $$T_{max}^{per\ candidate\ codeword}$$

conditions in place while $T_{max}$ is smaller than the number of candidate codewords times $$T_{max}^{per\ candidate\ codeword}.$$

While such a design may involve some heuristic optimization to determine the best limit values, it enables the Batch-DSCF decoder to benefit from the shared early termination while improving the BLER performance due to the shared computational resources.

The Batch DSC Flip decoder utilizes a likelihood metric such as that of the DSCF decoder to prioritize flip patterns and update each candidate codeword's list for next decoding iterations. While the metric can be computed the same way as in DSCF, it can be further improved by a secondary adjustment that mimics the blind detection metrics such that candidates that are more likely to carry valid DCI are given higher priorities throughout the shared decoding process. Such an improvements can be made by additionally or alternatively updating the metrics based on the input soft bits (e.g., LLRs as side channel information), based on the soft bits after initial SC decoding, or based on belief propagation schemes. In one example, the soft bits computed over the frozen polar indices can be used, which are not included in the DSCF decoding metric calculation by default. Incorporating a blind detection metric into the Batch-DSCF decoder enables the decoder to reduce the chances of locking into an invalid candidate and increases the convergence rate, which in turn reduces the computational requirements.

Figure 9:
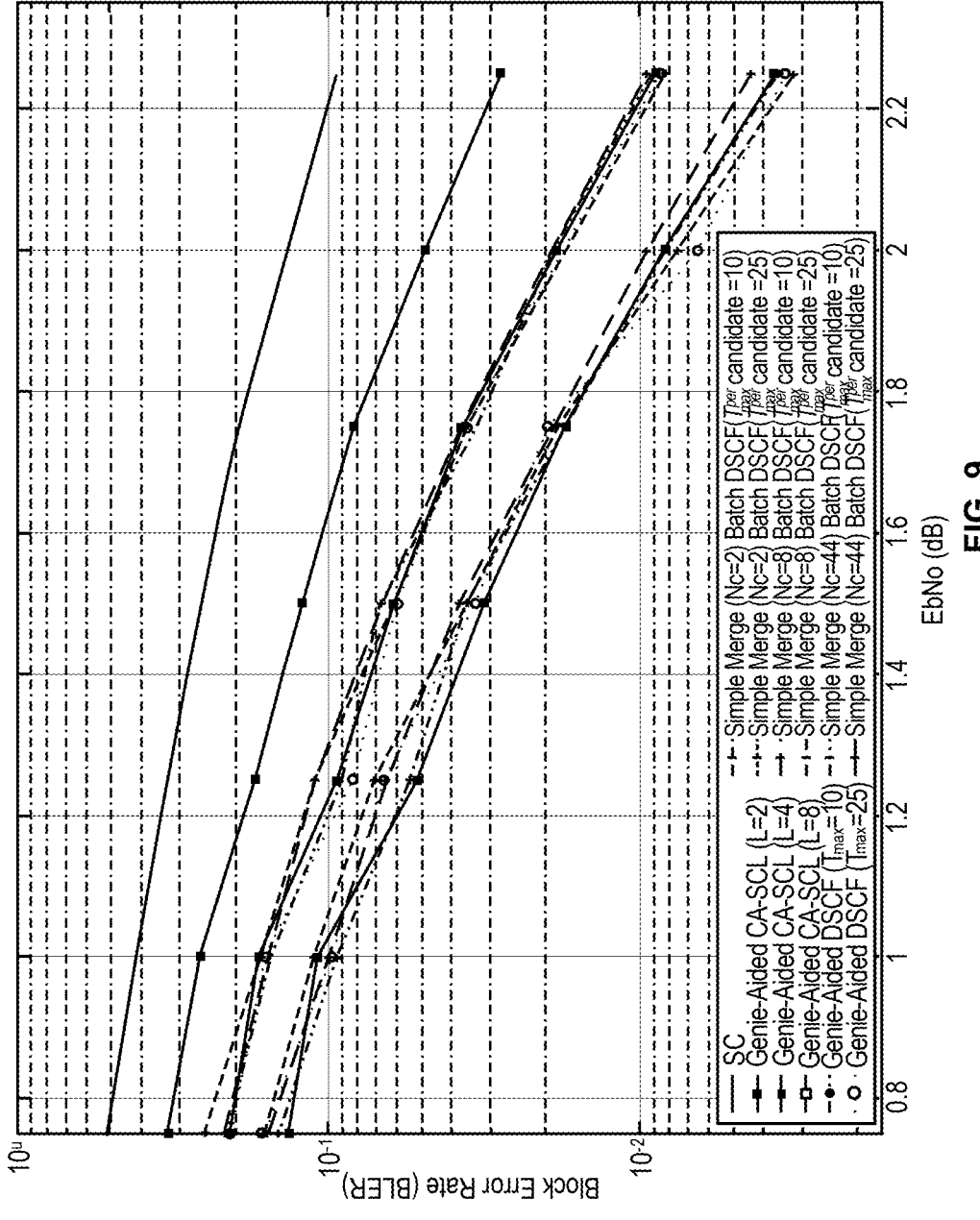
FIG. 9 illustrates performance examples of different decoding techniques including dynamic successive cancellation flip decoding in accordance with some embodiments in accordance with some embodiments.

FIG. 9 illustrates performance examples 900 of different decoding techniques including dynamic successive cancellation flip decoding in accordance with some embodiments in accordance with some embodiments. The performance examples 900 illustrate BLER as a function of SNR. As can be seen, the BLER performance of Batch-DSCF decoding approaches that of a genie-aided SCL decoding.

Figure 10:
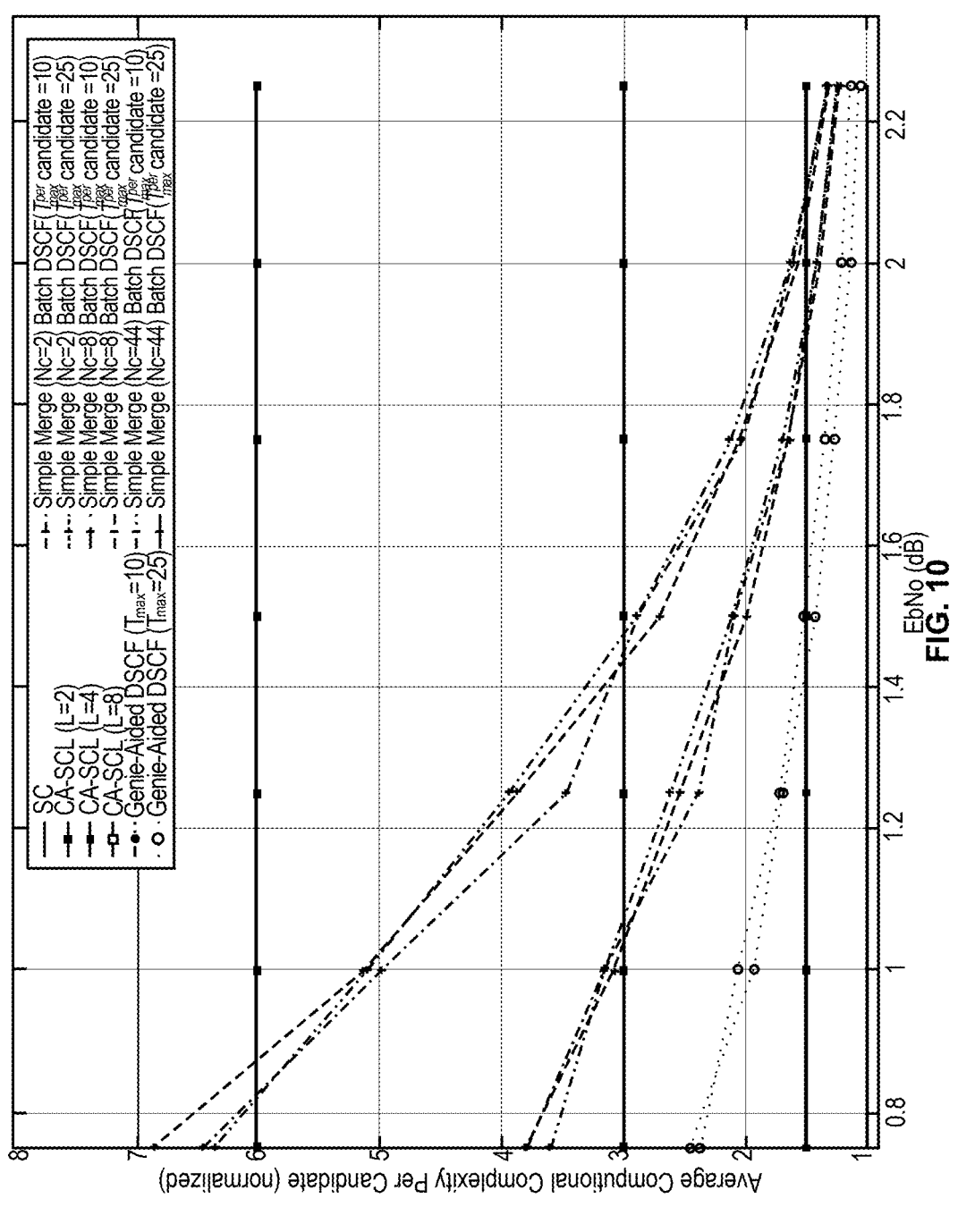
FIG. 10 illustrates power consumption examples of different decoding techniques including dynamic successive cancellation flip decoding in accordance with some embodiments.

FIG. 10 illustrates power consumption examples 1000 of different decoding techniques including dynamic successive cancellation flip decoding in accordance with some embodiments. The power consumption examples 1000 illustrate average power consumption as a function of SNR. As can be seen, the power consumption of Batch-DSCF decoding approaches or can be lower than that of SCL decoding and genie-aided SCL decoding at the mid to high SNR regions (which are typically the regions of interest, such as in the range of 1.6 dB and larger).

Figure 11:
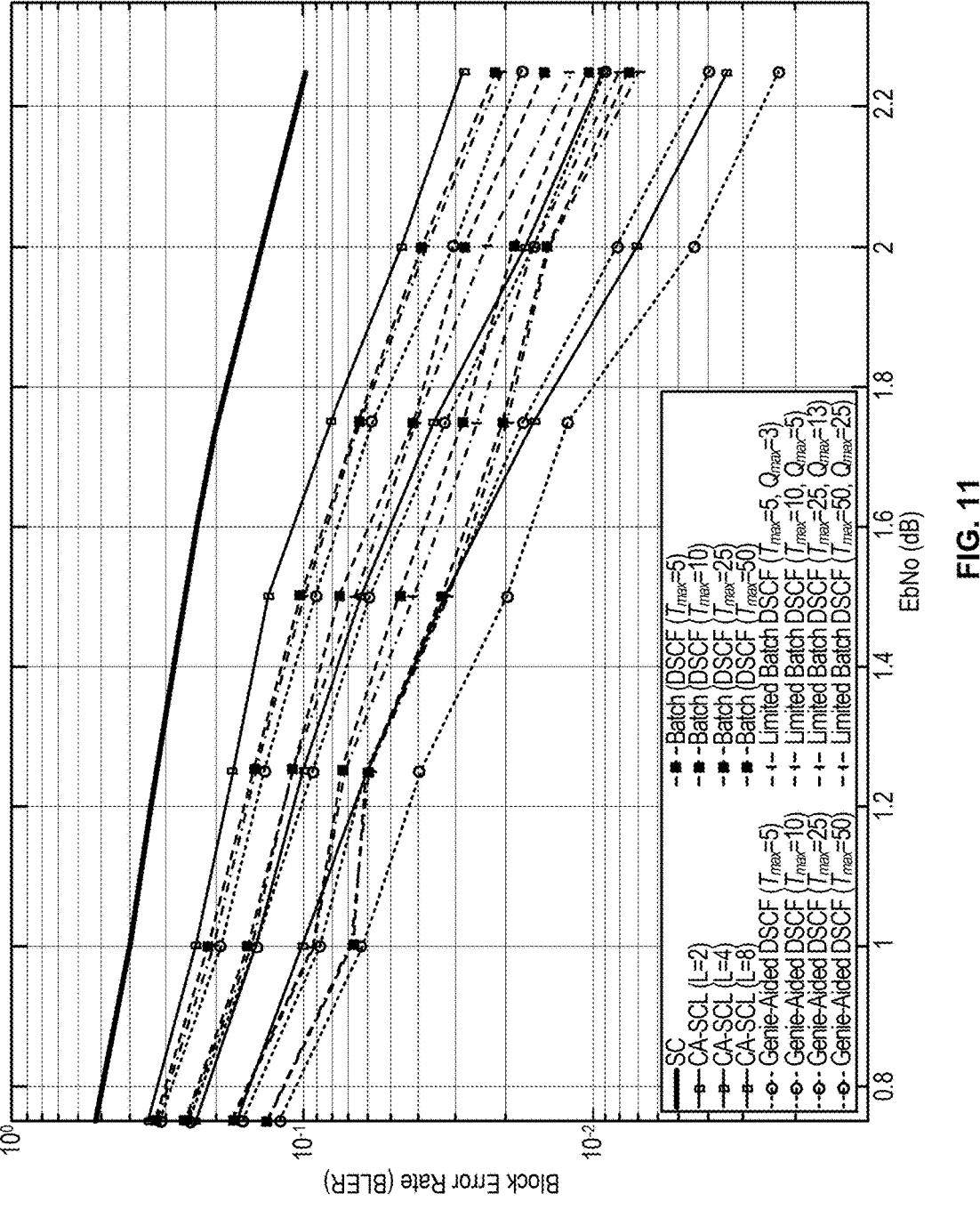
FIG. 11 illustrates block error rate examples of different decoding techniques including dynamic successive cancellation flip decoding in accordance with some embodiments.

FIG. 11 illustrates block error rate examples 1100 of different decoding techniques including dynamic successive cancellation flip decoding in accordance with some embodiments. The block error rate examples 1100 illustrate BLER as a function of SNR. Here, the Batch-DSCF decoding uses both parameters $Q_{max}$ and $T_{max}$. As can be seen, the BLER performance of Batch-DSCF decoding approaches that of a genie-aided SCL decoding.

Figure 12:
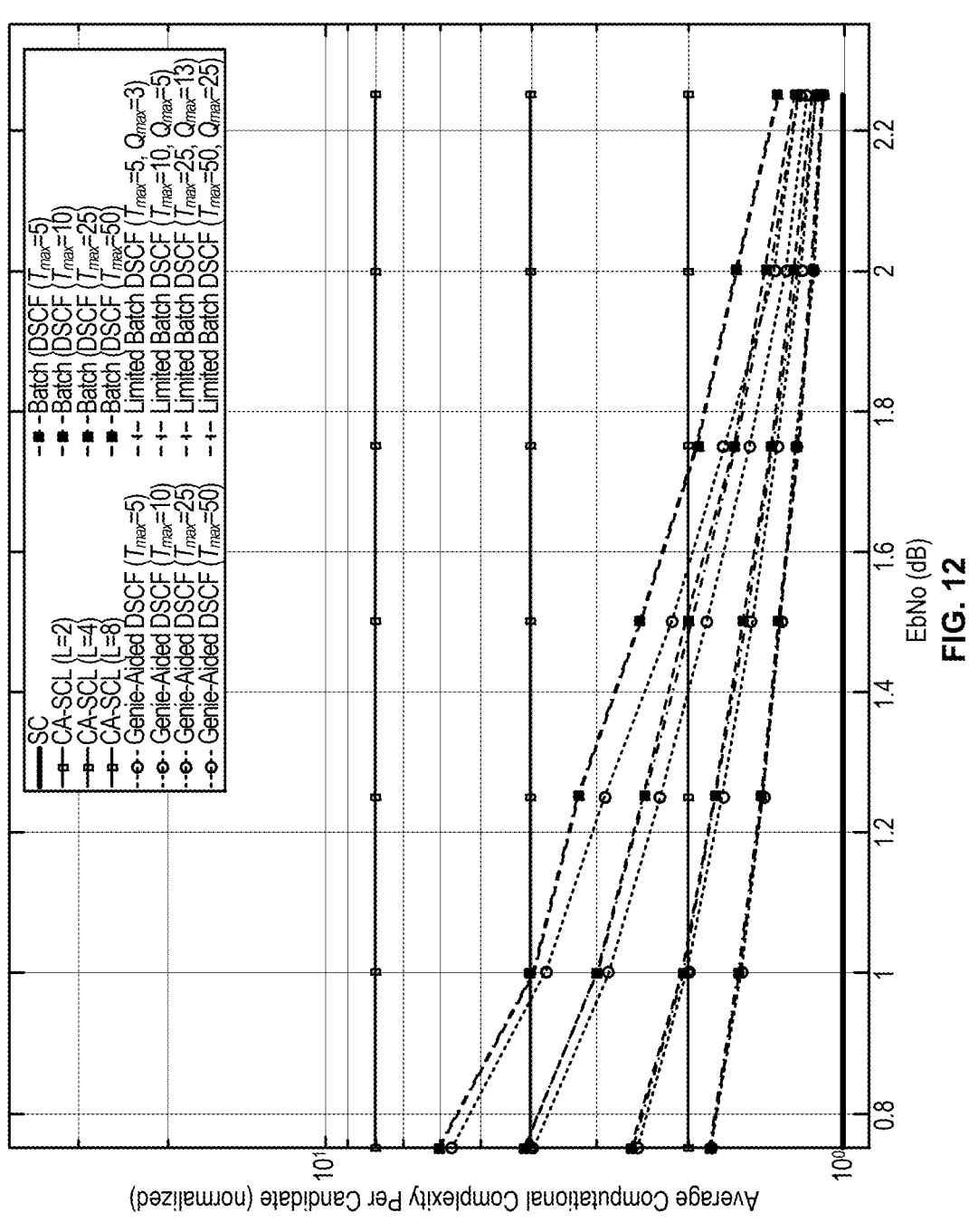
FIG. 12 illustrates power consumption examples of different decoding techniques including dynamic successive cancellation flip decoding in accordance with some embodiments.

FIG. 12 illustrates power consumption examples 1200 of different decoding techniques including dynamic successive cancellation flip decoding in accordance with some embodiments. The power consumption examples 1200 illustrate average power consumption as a function of SNR. Here, the Batch-DSCF decoding uses both parameters $Q_{max}$ and $T_{max}$. As can be seen, the power consumption of Batch-DSCF decoding approaches or can be lower than that of SCL decoding and genie-aided SCL decoding at the mid to high SNR regions (which are typically the regions of interest, such as in the range of 1.6 dB and larger).

Referring back to FIGS. 8-12, Batch-DSCF decoding of polar codes can represent a method of joint decoding and blind detection, tailored to applications such as blind decoding of 5G NR PDCCH candidates, where the Batch-DSCF decoder is tasked at both finding the candidates with valid DCI as well as estimating the DCI vector based on the received symbols. The input to the Batch-DSCF decoder includes multiple received symbols in the forms of soft-bits such as LLRs. Batch-DSCF decoding is initiated by first attempting a low-complexity decoding on all the candidates. SC decoding is one such example. The output of the initial SC decoding attempt is crossed checked against a CRC, which is the case of 5G NR PDCCH needs radio network temporary identifier (RNTI) information for the expected DCI formats. Those candidate codewords that fail the CRC check are passed to the second block of the Batch-DSCF decoder. In the second state, the flip patterns are prepared for the DSCF decoding. The flip patterns are generated by first computing metrics, such as the metric of the DSCF decoding algorithm. These flip patterns provide a guideline for making flipped decisions throughout the SC decoding in the future decoding iterations. The corresponding metrics provide an approximate for the likelihoods of these flip patterns and enable the decoder to prioritize these flip patterns. The metric used in the Batch-DSCF decoder can be further improved by incorporating the blind detection metrics that may depend on the input LLRs, the post-processing data computed upon the initial SC attempt, or both.

Batch-DSCF decoding is an iterative decoding algorithm. At each decoding iteration, the Batch-DSCF decoder attempts a low-complexity SC Flip decoding on one of the candidate codewords while following the flipped decision guideline that is given by the corresponding flip pattern at that iteration. The Batch-DSCF decoder is free to jump from one candidate codeword to another candidate codeword through the decoding iterations. This feature enables the Batch-DSCF decoder to not get trapped in decoding a candidate codeword with invalid DCI, which would consume a lot of computational resources.

A precise prediction of the expected DCI formats enables the Batch-DSCF decoder to create an efficient termination condition such that the decoding process is terminated as soon as all the expected DCI information are estimated. This feature is available because the Batch-DSCF decoder can switch between different candidate codewords at decoding iterations and select the one with highest chances of success for the SC Flip processing.

The Batch-DSCF decoding continues the decoding process until it discovers all the DCI information or when the iteration count reaches the predetermined maximum limit. The maximum number of iterations could be defined as per candidate, in total, or both. Each approach for defining the maximum limit results in a different tradeoff between the BLER performance and the average computational complexity. The maximum number of decoding iterations can be determined according to the timeline restrictions because the Batch-DSCF decoder is often not free to iterate indefinitely. Merging the flip patterns into a single shared pool relaxes the timeline restrictions and improves the overall performance when compared to the conventional DSCF decoding. Batch-DSCF decoding can perform as well as the CA-SCL decoding while needing significantly less computational power on average, particularly at reasonable SNR regions when a BLER of one to ten percent is expected. Low power consumption of the Batch-DSCF decoding makes this algorithm highly suitable for applications, where the UE is tight on power such as wearables and internet of things (IoT) devices. With the increased demand for low-power receivers in next generations of cellular systems, Batch-DSCF decoders can play a major role in shaping the standards as well as the system requirements decided by the 3GPP.

FIG. 13 illustrates an example of an operational flow/algorithmic structure 1300 for batch dynamic successive cancellation flip decoding in accordance with some embodiments. The operational flow/algorithmic structure 1300 can be implemented by a UE (e.g., performed by components thereof including, for example, an apparatus of the UE, where the apparatus includes processing circuitry; a modem is an example of such an apparatus). The UE can be any of the UEs described herein. In some embodiments, the operational flow/algorithmic structure 1300 may be implemented by executing instructions stored in a tangible, non-transitory, computer-readable storage medium, such as a memory of the UE. While the operational flow/algorithmic structure 1300 is described using steps in a specific sequence, it should be understood that the present disclosure contemplates that the described steps may be performed in different sequences than the sequence illustrated, and certain described steps may be omitted or not performed altogether.

In an example, the operational flow/algorithmic structure 1300 includes, at 1302, receiving soft bits corresponding to candidate codewords. The candidate codewords can correspond to polar codes encoding of DCI. Up to forty-four candidate codewords may be possible in a PDCCH search space configuration, each corresponding to possibly different DCI for different UEs.

In an example, the operational flow/algorithmic structure 1300 includes, at 1304, attempting to decode each candidate codeword by using a successive cancellation decoding procedure. As used herein, a procedure can refer to a decoding algorithm. As such, the successive cancellation decoding procedure can be an SC decoding algorithm. The soft bits corresponding to one candidate codeword can be input to a corresponding SC decoding algorithm. Given that forty-four candidate codewords may be decoded, forty-four instances of the SC decoding algorithm can be executed in parallel, each of which may be receiving soft bits corresponding to one of the forty-four candidate codewords. Nonetheless, it is possible to use different SC decoding algorithms (e.g., with different list sizes).

In an example, the operational flow/algorithmic structure 1300 includes, at 1306, determining whether CRC failures exist or not. For instance, the output of each SC decoding algorithm instead is checked to see if the output passes or fails CRC. Generally, CRC is used for error detection. Before transmission of information (by the transmit chain), CRC value is computed from the information and appended to the information block to then generate a codeword. Upon the decoding the corresponding candidate codeword by the SC decoding algorithm, the UE determines a decoded CRC value and computes CRC value from the decoded information. The UE compares both the decoded CRC value and the computed CRC value. If the two values match each other, the CRC is passed. Otherwise, the CRC is failed. Further, in the context of DCI and PDCCH blind decoding, the CRC value used in the transmission is masked with the RNTI of the UE so that to ensure that the DCI is intended of the correct UE. The UE can unmask the CRC using its own RNTI, thereby allowing the UE to determine that the DCI is intended for it as part of the CRC pass/failure check.

If the outputs of all of the SC decoders fail CRC, then no codeword is decoded and CRC failures are declared. In this case operation 1310 follows operation 1306. If one of the outputs passes CRC, then a codeword is decoded. In this case, if more than one codewords are expected to be decoded but only one output passes CRC, then the decoded codeword is removed from further decoding and the further decoding is applied to the remaining candidate codewords (e.g., CRC failure is declared for all the candidate codewords except the decoded codeword). Otherwise, no CRC failure is detected, and the decoding is successful. In this case, operation 1308 follows operation 1306.

In an example, the operational flow/algorithmic structure 1300 includes, at 1308, outputting the codeword(s) that passed CRC. At this point, the codeword(s) can indicate (as hard decisions on bit binary values) the DCI. No further decoding is needed.

In an example, the operational flow/algorithmic structure 1300 includes, at 1310, generating lists of flip patterns. Here, further decoding is needed for at least one codeword. For each candidate codeword to be further decoded, a list of flip patterns can be generated. The list is generated using DSCF decoding techniques (e.g., by deriving metrics for possible flip patterns and selecting "L" of such flip patterns based on the metrics without having to perform a full DSCF decoding to output a codeword). Each list is stored in memory. As such, it may be possible that up to forty-four lists of patterns are generated and stored. The lists may, but need not, have the same size. In other words, the same DSCF decoding algorithm may, but need not, be used in part for the different candidate codewords. In case it is the same DSCF decoding algorithm, up to forty-four instances thereof can be executed in parallel. In case of different DSCF decoding algorithms, the various instances can also be executed in parallel.

In an example, the operational flow/algorithmic structure 1300 includes, at 1312, selecting a flip pattern from the lists of flip patterns. For each list, a metric per flip pattern is output at operation 1310. As such, with up to forty-four lists, "44×$L_i$" flip patterns exist (where "$L_i$" is the list size for the corresponding candidate codeword "i") and, equivalently, "44×$L_i$" metrics (one per flip pattern). The flip pattern having the best metric (e.g., the highest value) is selected.

In an example, the operational flow/algorithmic structure 1300 includes, at 1314, attempting to decode the candidate codeword corresponding to the selected flip pattern, where the decoding here uses a successive cancellation flip decoding procedure (e.g., an SCF decoding algorithm including possibly a DSCF decoding algorithm). The SCF decoding algorithm results in decoding information and a value CRC in a current decoding iteration of Batch-DSCF decoding. The CRC can be checked in a manner similar to what is described at operation 1306.

In an example, the operational flow/algorithmic structure 1300 includes, at 1316, determine whether CRC failure exists or not. Here, the candidate codeword is decoded via the SCF decoding algorithm and, in the current decoding iteration, the decoded CRC value is checked against a computed CRC value (where the two values may be determined by also using the UE's RNTI). If the two values match each other, the CRC is passed and operation 1318 follows operation 1316. otherwise, the CRC is failed and operation 1322 follows operation 1316.

In an example, the operational flow/algorithmic structure 1300 includes, at 1318, determines whether the search for additional codeword is to be continued or not. For instance, more than one codeword may have been used to transmit DCI to the UE (e.g., based on the DCI format). Accordingly, the UE may have prior knowledge about the number of codewords that need to be successfully decoded. If "K" codewords are to be successfully decoded and "M<K" have been successfully decoded, the search continues, whereby operation 1326 follows operation 1318. Otherwise, the search need not continue and operation 1320 follows operation 1318.

In an example, the operational flow/algorithmic structure 1300 includes, at 1320, outputting the codeword. Here, a candidate codeword has been successfully decoded, resulting in a decoded codeword. This decoded codeword can indicate (as hard decisions on bit binary values) the DCI. No further decoding is needed.

In an example, the operational flow/algorithmic structure 1300 includes, at 1322, determining whether the maximum number of decoding iterations has been reached. This maximum number can be for all codewords to be decoded (e.g., $T_{max}$) and/or per codeword (e.g., $Q_{max}$). If this maximum number is for all codewords and is reached, operation 1324 can be performed, whereby a decoding failure is detected. If this maximum number is for a codeword and is reached, a decoding failure for that candidate codeword is detected (in which case the decoding failure for that candidate codeword can be declared, but the decoding can continue for other candidate codewords by removing the candidate codeword from the next decoding iteration of Batch-DSCF decoding and proceeding to operation 1326).

In an example, the operational flow/algorithmic structure 1300 includes, at 1324, a decoding failure is found. The decoding can stop. Here, if "M" codeword(s) has (have) been successfully decoded, but more than "M" codeword(s) is (are) expected but was (were) not successful decoded, the "M" codeword(s) can be stored in memory. The next set of candidate codewords can be received (e.g., following a HARQ procedure) and similarly decoded. The "M" codeword(s) can be used to avoid decoding candidate codewords that would be redundant to the already decoded "M" codeword(s).

In an example, the operational flow/algorithmic structure 1300 includes, at 1326, computing new metrics. For a candidate codeword (that has not been removed from the decoding), one or more metrics can be computed. Consider the candidate codeword corresponding to the flip pattern that was selected at operation 1312. Here, the metric of this flip pattern is updated so that this flip pattern is not selected again. Further, for each candidate codeword, side channel information (e.g., the LLRs of the soft bits) can be combined with the DSCF decoding algorithm for each pattern. Additionally, say the selected flip pattern indicates first bit locations to be flipped (e.g., from "0" to "1" or vice versa) and say that an unselected flip pattern indicates second bit locations to be flipped. A similarity score of the first bit locations and the second bit locations can be computed (e.g., this score is the highest when the bit locations to be flipped are the same in both flip patterns and is the lowest when the two flip patterns do not indicate any common bit location). The metrics of the remaining unselected flip patterns can be updated based on the corresponding similarity scores (e.g., the more similar an unselected flip pattern is to the selected flip pattern, the lower the metric of the selected flip pattern can be made).

In an example, the operational flow/algorithmic structure 1300 includes, at 1328, updating flip patterns. For instance, the selected flip pattern is removed. Further, this flip pattern can indicate bit locations to be flipped. Likelihood information can be available (e.g., based on soft information that is output by the SCF decoding algorithm) that a first bit location to be flipped is very likely to be correct, whereas a second bit location to be flipped is very likely to be incorrect (or more generally a likelihood of each of such bit locations to be correct). This information can be passed to the other flip patterns (e.g., an unselected flip pattern can be updated so that to retain the high likely correct bit location and replace the high likely incorrect bit location with another one). Operation 1328 loops back to operation 1312 to select another flip pattern and perform the next decoding iteration.

FIG. 14 illustrates another example of an operational flow/algorithmic structure for batch dynamic successive cancellation flip decoding in accordance with some embodiments. The operational flow/algorithmic structure 1400 can be implemented by a UE (e.g., performed by components thereof including, for example, an apparatus of the UE, where the apparatus includes processing circuitry; a modem is an example of such an apparatus). The UE can be any of the UEs described herein. In some embodiments, the operational flow/algorithmic structure 1400 may be implemented by executing instructions stored in a tangible, non-transitory, computer-readable storage medium, such as a memory of the UE. While the operational flow/algorithmic structure 1400 is described using steps in a specific sequence, it should be understood that the present disclosure contemplates that the described steps may be performed in different sequences than the sequence illustrated, and certain described steps may be omitted or not performed altogether. Further, one or more operations of the operational flow/algorithmic structure 1400 can include one or more operations of the operational flow/algorithmic structure 1300.

In an example, the operational flow/algorithmic structure 1400 includes, at 1402, accessing a plurality of lists of flip patterns, each list of the plurality of lists corresponding to a different candidate codeword that is generated according to a polar code encoding procedure. Each candidate codeword can correspond to DCI (or a block of the DCI). Operation 1402 can include operations 1404 and 1406. Each list can be generated by decoding a corresponding candidate codeword according to an SC decoding algorithm, detecting that the output of this algorithm fails CRC, and defining the list according to a DSCF flip pattern list generator.

In an example, the operational flow/algorithmic structure 1400 includes, at 1404, storing a first list of flip patterns corresponding to a first candidate codeword. For instance, this list is generated for the first candidate codeword upon a CRC failure associated with decoding this candidate codeword. The list is generated using DSCF decoding techniques (e.g., by deriving metrics for possible flip patterns and selecting "L" of such flip patterns based on the metrics without having to perform a full DSCF decoding to output a codeword).

In an example, the operational flow/algorithmic structure 1400 includes, at 1406, storing a second list of flip patterns corresponding to a second candidate codeword, the first candidate codeword and the second candidate codeword generated according to the polar codes encoding procedure. Here, operation 1406 can be similar to operation 1404.

In an example, the operational flow/algorithmic structure 1400 includes, at 1408, selecting a flip pattern of the plurality of lists (e.g., of the first list and the second list). For instance, the flip pattern can be selected from the first list based on this flip pattern having the best metric (e.g., the highest value) of all the metrics corresponding to the different flip patterns. In this illustration of selecting the flip pattern belonging to the first list, this selection corresponds to the first candidate codeword being selected.

In an example, the operational flow/algorithmic structure 1400 includes, at 1410, decoding a codeword by at least using the flip pattern in a successive cancellation flip decoding procedure for polar codes. Continuing with the illustration of the first candidate codeword being selected, an SCF decoding algorithm can be applied to according to the selected flip pattern (e.g., by flipping the binary values at bit locations indicated by the selected flip pattern). The output of this algorithm can include a CRC value usable for CRC. If the CRC passes, the candidate codeword has been decoded into the codeword. Otherwise, the CRC has failed and the Batch-DSCF decoding can iterate again according to the description of FIGS. 8 and 13.

Figure 15:
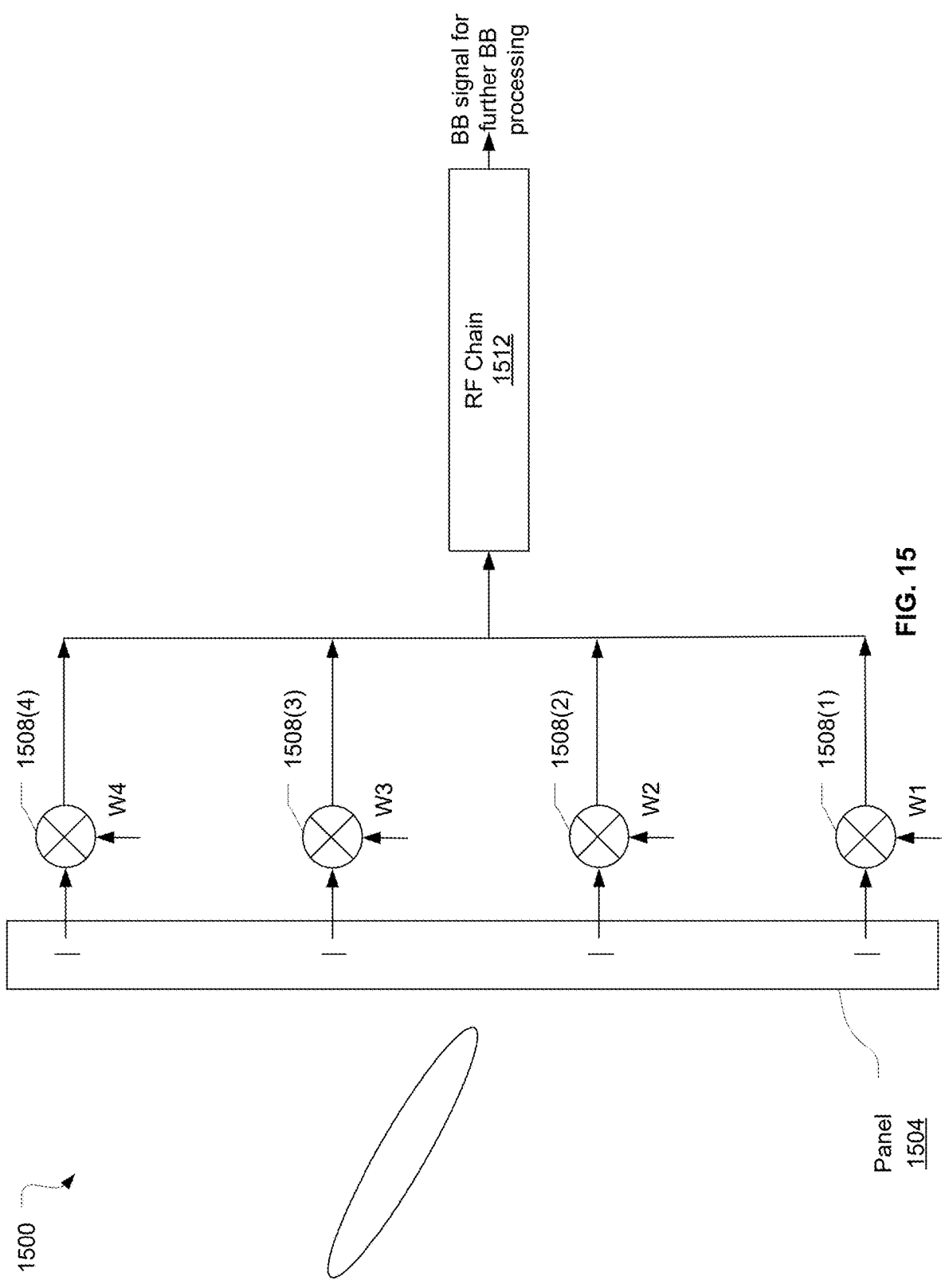
FIG. 15 illustrates an example of receive components in accordance with some embodiments.

FIG. 15 illustrates receive components 1500 of a receiver, such as any of the UE's described herein above, in accordance with some embodiments. The receive components 1500 may include an antenna panel 1504 that includes a number of antenna elements. The panel 1504 is shown with four antenna elements, but other embodiments may include other numbers.

The antenna panel 1504 may be coupled to analog beamforming (BF) components that include a number of phase shifters 1508(1)-1508(4). The phase shifters 1508(1)-1508(4) may be coupled with a radio-frequency (RF) chain 1512. The RF chain 1512 may amplify a receive analog RF signal, downconvert the RF signal to baseband, and convert the analog baseband signal to a digital baseband signal that may be provided to a baseband processor for further processing. In an example, receive components 1500 can include multiple antenna panels 1504 and/or multiple RF chains 1512. An MR can include an antenna panel 1504 and an RF chain 1512. An LP-WUR can include the same antenna panel 1504 or a different antenna panel and a different RF chain 1512.

In various embodiments, control circuitry, which may reside in a baseband processor, may provide BF weights (for example W1-W4), which may represent phase shift values, to the phase shifters 1508(1)-1508(4) to provide a receive beam at the antenna panel 1504. These BF weights may be determined based on the channel-based beamforming.

Figure 16:
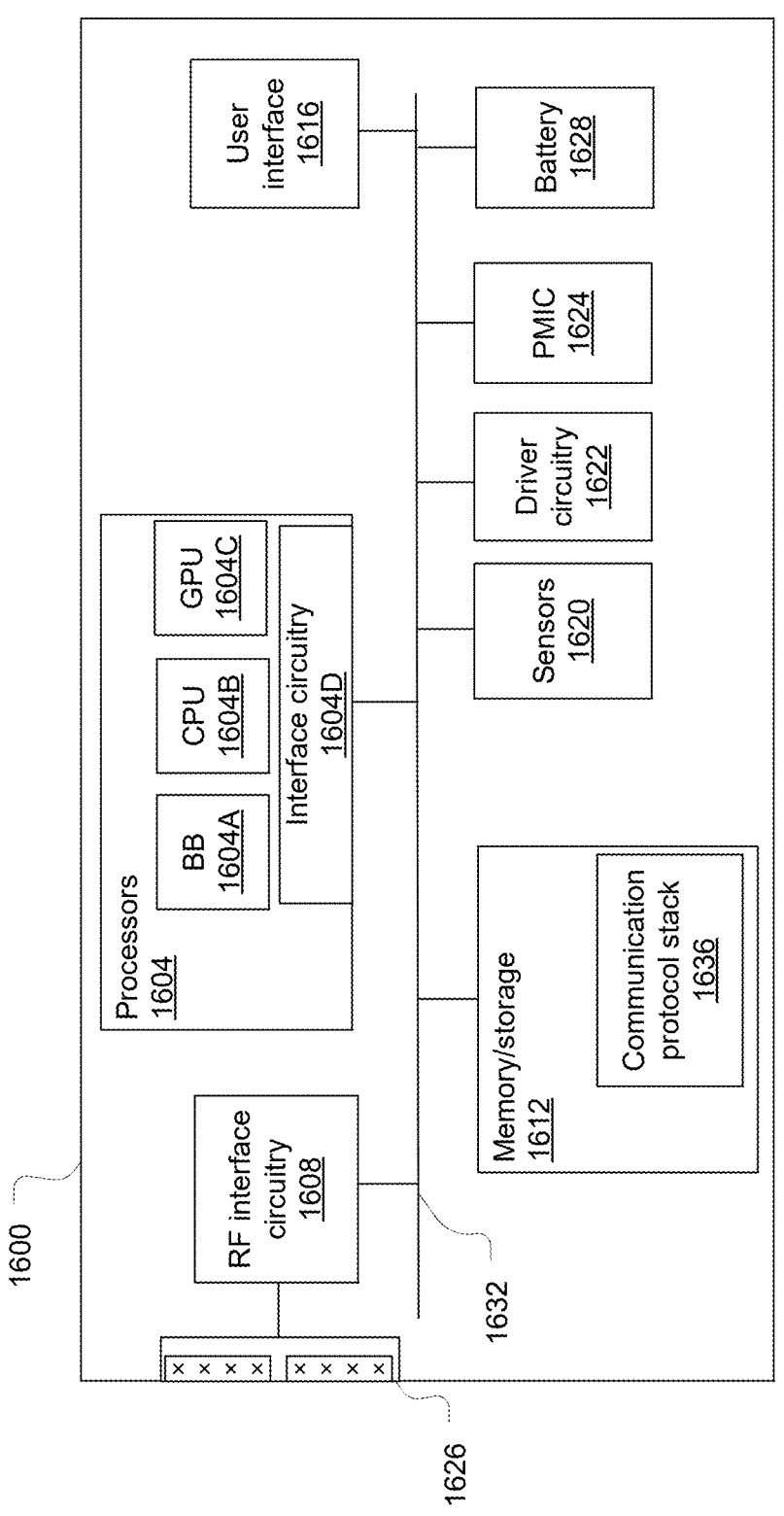
FIG. 16 illustrates an example of a UE in accordance with some embodiments.

FIG. 16 illustrates a UE 1600, in accordance with some embodiments. The UE 1600 may be similar to and substantially interchangeable with any of the UEs described herein above. Particularly, the UE 1600 can support Batch-DSCF decoding of polar codes at its receive chain and polar codes encoding at its transmit chain.

Similar to that described above with respect to UE 104, the UE 1600 may be any mobile or non-mobile computing device, such as mobile phones, computers, tablets, industrial wireless sensors (for example, microphones, carbon dioxide sensors, pressure sensors, humidity sensors, thermometers, motion sensors, accelerometers, laser scanners, fluid level sensors, inventory sensors, electric voltage/current meters, actuators, etc.), video surveillance/monitoring devices (for example, cameras, video cameras, etc.), wearable devices, or relaxed-IoT devices. In some embodiments, the UE may be a reduced capacity UE or NR-Light UE.

The UE 1600 may include processors 1604, RF interface circuitry 1608, memory/storage 1612, user interface 1616, sensors 1620, driver circuitry 1622, power management integrated circuit (PMIC) 1624, and battery 1628. The processors 1604, or portions thereof, can represent processing circuitry that can be coupled with an RF chain to form an MR or the LP-WUR. The components of the UE 1600 may be implemented as integrated circuits (ICs), portions thereof, discrete electronic devices, or other modules, logic, hardware, software, firmware, or a combination thereof. The block diagram of FIG. 16 is intended to show a high-level view of some of the components of the UE 1600. However, some of the components shown may be omitted, additional components may be present, and different arrangements of the components shown may occur in other implementations.

The components of the UE 1600 may be coupled with various other components over one or more interconnects 1632, which may represent any type of interface, input/output, bus (local, system, or expansion), transmission line, trace, optical connection, etc. that allows various circuit components (on common or different chips or chipsets) to interact with one another.

The processors 1604 may include processor circuitry, such as baseband processor circuitry (BB) 1604A, central processor unit circuitry (CPU) 1604B, and graphics processor unit circuitry (GPU) 1604C. The processors 1604 may include any type of circuitry or processor circuitry that executes or otherwise operates computer-executable instructions, such as program code, software modules, or functional processes from memory/storage 1612 to cause the UE 1600 to perform operations as described herein.

In some embodiments, the baseband processor circuitry 1604A may access a communication protocol stack 1636 in the memory/storage 1612 to communicate over a 3GPP compatible network. In general, the baseband processor circuitry 1604A may access the communication protocol stack to: perform user plane functions at a PHY layer, MAC layer, RLC layer, PDCP layer, SDAP layer, and PDU layer; and perform control plane functions at a PHY layer, MAC layer, RLC layer, PDCP layer, RRC layer, and a non-access stratum "NAS" layer. In some embodiments, the PHY layer operations may additionally/alternatively be performed by the components of the RF interface circuitry 1608.

The baseband processor circuitry 1604A may generate or process baseband signals or waveforms that carry information in 3GPP-compatible networks. In some embodiments, the waveforms for NR may be based on cyclic prefix OFDM (CP-OFDM) in the uplink or downlink, and discrete Fourier transform spread OFDM (DFT-S-OFDM) in the uplink.

The baseband processor circuitry 1604A may also access group information from memory/storage 1612 to determine search space groups in which a number of repetitions of a PDCCH may be transmitted.

The memory/storage 1612 may include any type of volatile or non-volatile memory that may be distributed throughout the UE 1600. In some embodiments, some of the memory/storage 1612 may be located on the processors 1604 themselves (for example, L1 and L2 cache), while other memory/storage 1612 is external to the processors 1604 but accessible thereto via a memory interface. The memory/storage 1612 may include any suitable volatile or non-volatile memory, such as, but not limited to, dynamic random-access memory (DRAM), static random-access memory (SRAM), erasable programmable read-only memory (EPROM), electrically erasable programmable read-only memory (EEPROM), Flash memory, solid-state memory, or any other type of memory device technology.

The RF interface circuitry 1608 may include transceiver circuitry and a radio frequency front module (RFEM) that allows the UE 1600 to communicate with other devices over a radio access network. The RF interface circuitry 1608 may include various elements arranged in transmit or receive paths. These elements may include, for example, switches, mixers, amplifiers, filters, synthesizer circuitry, control circuitry, etc.

In the receive path, the RFEM may receive a radiated signal from an air interface via an antenna 1650 and proceed to filter and amplify (with a low-noise amplifier) the signal. The signal may be provided to a receiver of the transceiver that down-converts the RF signal into a baseband signal that is provided to the baseband processor of the processors 1604.

In the transmit path, the transmitter of the transceiver up-converts the baseband signal received from the baseband processor and provides the RF signal to the RFEM. The RFEM may amplify the RF signal through a power amplifier prior to the signal being radiated across the air interface via the antenna 1650.

In various embodiments, the RF interface circuitry 1608 may be configured to transmit/receive signals in a manner compatible with NR access technologies.

The antenna 1650 may include a number of antenna elements that each convert electrical signals into radio waves to travel through the air and to convert received radio waves into electrical signals. The antenna elements may be arranged into one or more antenna panels. The antenna 1650 may have antenna panels that are omnidirectional, directional, or a combination thereof to enable beamforming and multiple input, multiple output communications. The antenna 1650 may include microstrip antennas, printed antennas fabricated on the surface of one or more printed circuit boards, patch antennas, phased array antennas, etc. The antenna 1650 may have one or more panels designed for specific frequency bands including bands in FR1 or FR2.

The user interface circuitry 1616 includes various input/output (I/O) devices designed to enable user interaction with the UE 1600. The user interface 1616 includes input device circuitry and output device circuitry. Input device circuitry includes any physical or virtual means for accepting an input including, inter alia, one or more physical or virtual buttons (for example, a reset button), a physical keyboard, keypad, mouse, touchpad, touchscreen, microphones, scanner, headset, or the like. The output device circuitry includes any physical or virtual means for showing information or otherwise conveying information, such as sensor readings, actuator position(s), or other like information. Output device circuitry may include any number or combinations of audio or visual display, including, inter alia, one or more simple visual outputs/indicators (for example, binary status indicators, such as light emitting diodes (LEDs) and multi-character visual outputs, or more complex outputs, such as display devices or touchscreens (for example, liquid crystal displays (LCDs), LED displays, quantum dot displays, projectors, etc.), with the output of characters, graphics, multimedia objects, and the like being generated or produced from the operation of the UE 1600.

The sensors 1620 may include devices, modules, or subsystems whose purpose is to detect events or changes in its environment and send the information (sensor data) about the detected events to some other device, module, subsystem, etc. Examples of such sensors include, inter alia, inertia measurement units comprising accelerometers; gyroscopes; or magnetometers; microelectromechanical systems or nanoelectromechanical systems comprising 3-axis accelerometers; 3-axis gyroscopes; or magnetometers; level sensors; flow sensors; temperature sensors (for example, thermistors); pressure sensors; barometric pressure sensors; gravimeters; altimeters; image capture devices (for example; cameras or lensless apertures); light detection and ranging sensors; proximity sensors (for example, infrared radiation detector and the like); depth sensors; ambient light sensors; ultrasonic transceivers; microphones or other like audio capture devices; etc.

The driver circuitry 1622 may include software and hardware elements that operate to control particular devices that are embedded in the UE 1600, attached to the UE 1600, or otherwise communicatively coupled with the UE 1600. The driver circuitry 1622 may include individual drivers allowing other components to interact with or control various input/output (I/O) devices that may be present within, or connected to, the UE 1600. For example, driver circuitry 1622 may include a display driver to control and allow access to a display device, a touchscreen driver to control and allow access to a touchscreen interface, sensor drivers to obtain sensor readings of sensor circuitry 1620 and control and allow access to sensor circuitry 1620, drivers to obtain actuator positions of electro-mechanic components or control and allow access to the electro-mechanic components, a camera driver to control and allow access to an embedded image capture device, audio drivers to control and allow access to one or more audio devices.

The PMIC 1624 may manage power provided to various components of the UE 1600. In particular, with respect to the processors 1604, the PMIC 1624 may control power-source selection, voltage scaling, battery charging, or DC-to-DC conversion.

In some embodiments, the PMIC 1624 may control, or otherwise be part of, various power saving mechanisms of the UE 1600. For example, if the platform UE is in an RRC_Connected state, where it is still connected to the RAN node as it expects to receive traffic shortly, then it may enter a state known as Discontinuous Reception Mode (DRX) after a period of inactivity. During this state, the UE 1600 may power down for brief intervals of time and thus save power. If there is no data traffic activity for an extended period of time, then the UE 1600 may transition off to an RRC_Idle state, where it disconnects from the network and does not perform operations, such as channel quality feedback, handover, etc. The UE 1600 goes into a very low power state and it performs paging where again it periodically wakes up to listen to the network and then powers down again. The UE 1600 may not receive data in this state; in order to receive data, it must transition back to RRC_Connected state. An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

A battery 1628 may power the UE 1600, although in some examples the UE 1600 may be mounted deployed in a fixed location and may have a power supply coupled to an electrical grid. The battery 1628 may be a lithium-ion battery, a metal-air battery, such as a zinc-air battery, an aluminum-air battery, a lithium-air battery, and the like. In some implementations, such as in vehicle-based applications, the battery 1628 may be a typical lead-acid automotive battery.

Figure 17:
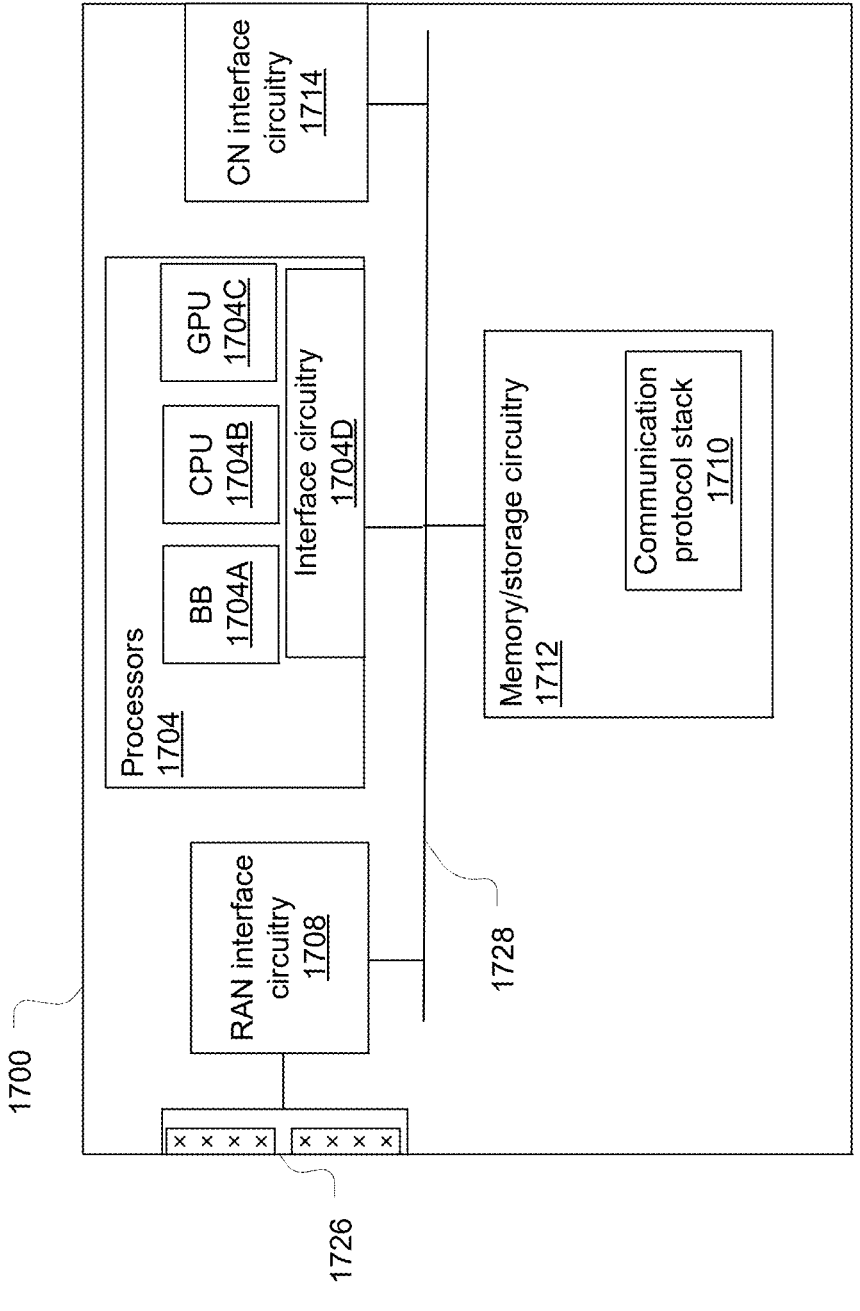
FIG. 17 illustrates an example of a base station in accordance with some embodiments.

FIG. 17 illustrates a gNB 1700, in accordance with some embodiments. The gNB 1700 may be similar to and substantially interchangeable with the base station 108 of FIG. 1 and other base stations described herein above. Particularly, the gNB 1700 can support polar codes encoding at its transmit chain and Batched-DSCF decoding of polar codes at its receive chain.

The gNB 1700 may include processors 1704, RAN interface circuitry 1708, core network (CN) interface circuitry 1712, and memory/storage circuitry 1716.

The components of the gNB 1700 may be coupled with various other components over one or more interconnects 1728.

The processors 1704, RAN interface circuitry 1708, memory/storage circuitry 1716 (including communication protocol stack 1710), antenna 1750, and interconnects 1728 may be similar to like-named elements shown and described with respect to FIG. 16.

The CN interface circuitry 1712 may provide connectivity to a core network, for example, a Fifth Generation Core network (5GC) using a 5GC-compatible network interface protocol, such as carrier Ethernet protocols, or some other suitable protocol. Network connectivity may be provided to/from the gNB 1700 via a fiber optic or wireless backhaul. The CN interface circuitry 1712 may include one or more dedicated processors or FPGAs to communicate using one or more of the aforementioned protocols. In some implementations, the CN interface circuitry 1712 may include multiple controllers to provide connectivity to other networks using the same or different protocols.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

For one or more embodiments, at least one of the components set forth in one or more of the preceding figures may be configured to perform one or more operations, techniques, processes, or methods as set forth in the example section below. For example, the baseband circuitry as described above in connection with one or more of the preceding figures may be configured to operate in accordance with one or more of the examples set forth below. For another example, circuitry associated with a UE, base station, network element, etc. as described above in connection with one or more of the preceding figures may be configured to operate in accordance with one or more of the examples set forth below in the example section.

EXAMPLES

In the following sections, further exemplary embodiments are provided.

Example 1 includes a method comprising: storing a first list of flip patterns corresponding to a first candidate codeword; storing a second list of flip patterns corresponding to a second candidate codeword, the first candidate codeword and the second candidate codeword generated according to a polar codes encoding procedure; selecting a flip pattern of the first list and the second list; and decoding a codeword by at least using the flip pattern in a successive cancellation flip decoding procedure for polar codes.

Example 2 includes a method comprising: accessing a plurality of lists of flip patterns, each list of the plurality of lists corresponding to a different candidate codeword that is generated according to a polar codes encoding procedure; selecting a flip pattern of the plurality of lists; and decoding a codeword by at least using the flip pattern in a successive cancellation flip decoding procedure for polar codes.

Example 3 includes the method of any example 1-2, wherein the first list is generated based on successive cancellation decoding procedure for polar codes and is stored based on a cyclic redundancy check (CRC) failure.

Example 4 includes the method of example 3, wherein the flip pattern is selected based on a metric associated with the successive decoding procedure for polar codes.

Example 5 includes the method of example 4, wherein the flip pattern is selected further based on soft bits associated with the first candidate codeword.

Example 6 includes the method of any example 1-5, wherein the codeword is decoded in a current decoding iteration, and wherein the method further comprises: prior to selecting the flip pattern, updating metrics based on a previous decoding iteration, wherein each one of the metrics corresponds to a different pattern of the first list and the second list, and wherein the flip pattern is selected based on an updated metric that corresponds to the flip pattern.

Example 7 includes the method of any example 1-6, wherein the codeword is decoded in a current decoding iteration, wherein the flip pattern is a first flip pattern, and wherein the method further comprises: prior to selecting the first flip pattern and based on a previous decoding iteration, removing a second flip pattern from the first list or the second list to form a set of remaining flip patterns, wherein the first flip pattern is selected from the set.

Example 8 includes the method of any example 1-7, wherein the codeword is decoded in a current decoding iteration, and wherein the method further comprises: determining that, in the current decoding iteration, an output of the successive cancellation flip decoding procedure for polar codes passes a cyclic redundancy check (CRC), wherein the codeword corresponds to the output.

Example 9 includes the method of example 8, wherein the flip pattern is a first flip pattern, wherein the codeword is a first successfully decoded codeword that is output from a current decoding iteration, and wherein the method further comprises: determining that a search for one or more additional codewords is to continue; and successfully decoding a second codeword by at least using, in a next decoding iteration, a second flip pattern in the successive cancellation flip decoding procedure for polar codes.

Example 10 includes the method of example 9, further comprising: removing the first flip pattern from the first list or the second list to form a set of remaining flip patterns; and selecting the second flip pattern from the set for use in the next decoding iteration.

Example 11 includes the method of example 10, further comprising: prior to selecting the second flip pattern, updating metrics based on the current decoding iteration, wherein each one of the metrics corresponds to a different pattern of the set, and wherein the second flip pattern is selected based on an updated metric that corresponds to the second flip pattern.

Example 12 includes the method of example 9, wherein a first total number "Qmax" of decoding iterations is defined per candidate codeword and is smaller than or equal to a second total number "Tmax" of decoding iterations allowed for attempting to decode multiple candidate codewords.

Example 13 includes the method of any example 1-12, wherein the codeword is decoded in a current decoding iteration, and wherein the method further comprises: prior to the current decoding iteration, determining that an output of the successive cancellation flip decoding procedure for polar codes fails a cyclic redundancy check (CRC); and prior to the current decoding iteration, determining that a total number "Tmax" of decoding iterations allowed for attempting to decode multiple candidate codewords has not been reached, wherein the current decoding iteration is performed based on the CRC being failed and the total number "Tmax" not being reached.

Example 14 includes the method of example 13, wherein the total number "Tmax" is defined based on an expected number of codewords to be decoded.

Example 15 includes the method of any example 1-14, wherein the codeword corresponds to downlink control information (DCI) sent in a physical downlink control channel (PDCCH), and wherein the successive cancellation flip decoding procedure for polar codes corresponds to blind DCI decoding.

Example 16 includes the method of any example 1-15, wherein a total number of candidate codewords to be decoded is up to forty-four.

Example 17 includes the method of any example 1-16, wherein a first list of patterns corresponding to a first candidate codeword has a different size than a second list of patterns corresponding to a second candidate codeword.

Example 18 includes the method of any example 1-17, further comprising: attempting to decode a candidate codeword by at least using a successive cancellation decoding procedure; determining that an output of the successive cancellation decoding procedure corresponds to a cyclic redundancy check (CRC) failure; and generating, based on the CRC failure, a list of patterns corresponding to the candidate codeword.

Example 19 includes the method of Example 17 includes the method of any example 1-18, wherein the codeword is decoding in a plurality of iterations, wherein a different pattern from the plurality of lists is selected at each decoding iteration.

Example 20 includes a user equipment (UE) or an apparatus comprising: one or more processors; and one or more memory storing instructions that, upon execution by the one or more processors, configure the UE or the apparatus to perform a method described in or related to any of the preceding examples.

Example 21 includes one or more computer-readable media storing instructions that, when executed on a user equipment (UE) or an apparatus, cause the UE or the apparatus to perform operations comprising one or more elements of a method described in or related to any of the preceding examples.

Example 22 includes an apparatus comprising means to perform one or more elements of a method described in or related to any of the preceding examples.

Example 23 includes one or more non-transitory computer-readable media comprising instructions to cause an apparatus, upon execution of the instructions by one or more processors of the apparatus, to perform one or more elements of a method described in or related to any of the preceding examples.

Example 24 includes an apparatus comprising logic, modules, or processing circuitry configured to perform one or more elements of a method described in or related to any of the preceding examples.

Example 25 includes an apparatus or a system comprising: one or more processors and one or more computer-readable media comprising instructions that, when executed by the one or more processors, cause the one or more processors to perform one or more elements of a method described in or related to any of the preceding examples.

Any of the above-described examples may be combined with any other example (or combination of examples), unless explicitly stated otherwise. The foregoing description of one or more implementations provides illustration and description but is not intended to be exhaustive or to limit the scope of embodiments to the precise form disclosed. Modifications and variations are possible in light of the above teachings or may be acquired from practice of various embodiments.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
   storing a first list of first flip patterns corresponding to a first candidate codeword, wherein the first list is generated based on a successive cancellation decoding procedure for polar codes and is stored based on a cyclic redundancy check (CRC) failure;
   storing a second list of second flip patterns corresponding to a second candidate codeword, the first candidate codeword and the second candidate codeword generated according to a polar codes encoding procedure;
   selecting a flip pattern of the first list and the second list, the flip pattern corresponding to one of the first flip patterns or one of the second flip patterns; and
   decoding a codeword by at least using the flip pattern in a successive cancellation flip decoding procedure for polar codes.

2. The method of claim 1, wherein the flip pattern is selected based on a metric associated with the successive cancellation decoding procedure for polar codes.

3. The method of claim 2, wherein the flip pattern is selected further based on soft bits associated with the first candidate codeword.

4. The method of claim 1, wherein the codeword is decoded in a current decoding iteration, and wherein the method further comprises:
   prior to selecting the flip pattern, updating metrics based on a previous decoding iteration, wherein each one of the metrics corresponds to a different pattern of the first list and the second list, and wherein the flip pattern is selected based on an updated metric that corresponds to the flip pattern.

5. The method of claim 1, wherein the codeword is decoded in a current decoding iteration, wherein the flip pattern is a first flip pattern, and wherein the method further comprises:
   prior to selecting the first flip pattern and based on a previous decoding iteration, removing a second flip pattern from the first list or the second list to form a set of remaining flip patterns, wherein the first flip pattern is selected from the set.

6. The method of claim 1, wherein the codeword is decoded in a current decoding iteration, and wherein the method further comprises:
   determining that, in the current decoding iteration, an output of the successive cancellation flip decoding procedure for polar codes passes a CRC, wherein the codeword corresponds to the output.

7. The method of claim 6, wherein the flip pattern is a first flip pattern, wherein the codeword is a first successfully decoded codeword that is output from a current decoding iteration, and wherein the method further comprises:
   determining that a search for one or more additional codewords is to continue; and
   successfully decoding a second codeword by at least using, in a next decoding iteration, a second flip pattern in the successive cancellation flip decoding procedure for polar codes.

8. The method of claim 7, further comprising:
   removing the first flip pattern from the first list or the second list to form a set of remaining flip patterns; and
   selecting the second flip pattern from the set for use in the next decoding iteration.

9. The method of claim 8, further comprising:
   prior to selecting the second flip pattern, updating metrics based on the current decoding iteration, wherein each one of the metrics corresponds to a different pattern of the set, and wherein the second flip pattern is selected based on an updated metric that corresponds to the second flip pattern.

10. The method of claim 7, wherein a first total number "Qmax" of decoding iterations is defined per candidate codeword and is smaller than or equal to a second total number "Tmax" of decoding iterations allowed for attempting to decode multiple candidate codewords.

11. The method of claim 1, wherein the codeword is decoded in a current decoding iteration, and wherein the method further comprises:
   prior to the current decoding iteration, determining that an output of the successive cancellation flip decoding procedure for polar codes fails a CRC; and
   prior to the current decoding iteration, determining that a total number "Tmax" of decoding iterations allowed for attempting to decode multiple candidate codewords has not been reached, wherein the current decoding iteration is performed based on the CRC being failed and the total number "Tmax" not being reached.

12. The method of claim 1, wherein the second list is generated based on another successive cancellation decoding procedure for polar codes and is stored based on another CRC failure.

13. The method of claim 11, wherein the total number "Tmax" is defined based on an expected number of codewords to be decoded.

14. An apparatus comprising:

processing circuitry configured to:

access a plurality of lists of flip patterns, each list of the plurality of lists corresponding to a different candidate codeword that is generated according to a polar codes encoding procedure, wherein a first list of the plurality of lists is generated based on a successive cancellation decoding procedure for polar codes and is stored based on a cyclic redundancy check (CRC) failure;

select a flip pattern of the plurality of lists, the flip pattern corresponding to one of the flip patterns; and decode a codeword by at least using the flip pattern in a successive cancellation flip decoding procedure for polar codes.

15. The apparatus of claim 14, wherein the codeword corresponds to downlink control information (DCI) sent in a physical downlink control channel (PDCCH), and wherein the successive cancellation flip decoding procedure for polar codes corresponds to blind DCI decoding.

16. The apparatus of claim 14, wherein a total number of candidate codewords to be decoded is up to forty-four.

17. The apparatus of claim 14, wherein first lists corresponds to a first candidate codeword and has a different size than a second list of flip patterns corresponding to a second candidate codeword.

18. One or more computer-readable storage media storing instructions that, upon execution by one or more processors, cause operations comprising:

accessing a plurality of lists of flip patterns, each list of the plurality of lists corresponding to a different candidate codeword that is generated according to a polar codes encoding procedure, wherein a first list of the plurality of lists is generated based on a successive cancellation decoding procedure for polar codes and is stored based on a cyclic redundancy check (CRC) failure;

selecting a flip pattern of the plurality of lists, the flip pattern corresponding to one of the flip patterns; and decoding a codeword by at least using the flip pattern in a successive cancellation flip decoding procedure for polar codes.

19. The one or more computer-readable storage media of claim 18, wherein the operations further comprise:

attempting to decode a candidate codeword by at least using the successive cancellation decoding procedure;

determining that an output of the successive cancellation decoding procedure corresponds to the CRC failure; and generating, based on the CRC failure, the first list corresponding to the candidate codeword.

20. The one or more computer-readable storage media of claim 18, wherein the codeword is decoded in a plurality of iterations, wherein a different flip pattern from the plurality of lists is selected at each decoding iteration.

\* \* \* \* \*